(12) United States Patent
Miszta et al.

(10) Patent No.: US 9,647,154 B2
(45) Date of Patent: May 9, 2017

(54) ORDERED SUPERSTRUCTURES OF OCTAPOD-SHAPED NANOCRYSTALS, THEIR PROCESS OF FABRICATION AND USE THEREOF

(75) Inventors: Karol Miszta, Stoczek Lukowski (PL); Dirk Dorfs, Campomorone (IT); Giovanni Bertoni, Modena (IT); Liberato Manna, Genoa (IT); Rosaria Brescia, Mola di Bari (IT); Sergio Marras, Cagliari (IT); Roberto Cingolani, Arnesano (IT); Roman Krahne, Genoa (IT); Yang Zhang, Genoa (IT); Fen Qiao, Dalian (CN)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 575 days.

(21) Appl. No.: 14/236,182

(22) PCT Filed: Aug. 2, 2011

(86) PCT No.: PCT/EP2011/063304
§ 371 (c)(1),
(2), (4) Date: Jan. 30, 2014

(87) PCT Pub. No.: WO2013/017166
PCT Pub. Date: Feb. 7, 2013

(65) Prior Publication Data
US 2014/0170383 A1    Jun. 19, 2014

(51) Int. Cl.
*H01L 21/02* (2006.01)
*H01L 31/0352* (2006.01)
*B82Y 40/00* (2011.01)
*C30B 5/00* (2006.01)
*C30B 29/60* (2006.01)
(Continued)

(52) U.S. Cl.
CPC .......... *H01L 31/0352* (2013.01); *B82Y 10/00* (2013.01); *B82Y 40/00* (2013.01);
(Continued)

(58) Field of Classification Search
CPC ......... B82Y 10/00; B82Y 40/00; C30B 29/60; C30B 5/00; H01L 21/02595;
(Continued)

(56) References Cited

U.S. PATENT DOCUMENTS

2007/0186846 A1    8/2007 Yong et al.
2009/0098366 A1    4/2009 Smoukov et al.
(Continued)

FOREIGN PATENT DOCUMENTS

WO    2008/127378    10/2008

OTHER PUBLICATIONS

Deka et al. Nano Letters "Octapod-Shaped Colloidal Nanocrystals of Cadmium Chalcogenides via "One Pot" Cation Exchange and Seeded Growth" Published Aug. 11, 2010, pp. 3770-3776.*
(Continued)

*Primary Examiner* — Aaron Austin
*Assistant Examiner* — Laura Figg
(74) *Attorney, Agent, or Firm* — Nixon & Vanderhye PC

(57) ABSTRACT

This invention relates to the controlled realization of ordered superstructures of octapod-shaped colloidal nanocrystals, formed either in the liquid phase or on a solid substrate. These structures can be applied in many fields of technology.

18 Claims, 12 Drawing Sheets

(51) Int. Cl.
  *H01L 29/12* (2006.01)
  *H01L 29/06* (2006.01)
  *H01L 29/15* (2006.01)
  *B82Y 10/00* (2011.01)

(52) U.S. Cl.
  CPC ............... *C30B 5/00* (2013.01); *C30B 29/60* (2013.01); *H01L 21/02595* (2013.01); *H01L 29/0665* (2013.01); *H01L 29/127* (2013.01); *H01L 29/151* (2013.01); *Y10T 428/24372* (2015.01)

(58) Field of Classification Search
  CPC . H01L 29/0665; H01L 29/127; H01L 29/151; H01L 31/0352; Y10T 428/24372
  USPC ......................................... 438/488; 252/519.4
  See application file for complete search history.

(56) References Cited

U.S. PATENT DOCUMENTS

2010/0116326 A1 5/2010 Gur et al.
2013/0032767 A1 2/2013 Manna et al.

OTHER PUBLICATIONS

Int'l Search Report and Written Opinion for PCT/IB2011/063304, mailed Nov. 17, 2011.
Chen et al., "Structure direction of II-VI semiconductor quantum dot binary nanoparticle superlattices by tuning radius ratio" *ACS Nano*, vol. 2, No. 6, pp. 1219-1229 (Jun. 2008).
Deka et al., "Octapod-shaped colloidal nanocrystals of cadmium chalcogenides via "one-pot" cation exchange and seeded growth" *Nano Lett.*, vol. 10, No. 9, pp. 3770-3776 (Sep. 2010).
Desantis et al., "Octopods versus concave nanocrystals: Control of morphology by manipulating the kinetics of seeded growth via co-reduction" *Nano Lett.*, vol. 11, No. 5, pp. 2164-2168 (May 2011).
Huang et al., "Controllable self-assembly of PbS nanostars into ordered structures: Close-packed arrays and patterned arrays" *ACS Nano*, vol. 4, No. 8, pp. 4707-4716 (Aug. 2010).
Scotognella et al., "Ultrafast exciton dynamics in colloidal CdSe/CdS octapod shaped nanocrystals" *J. Phys. Chem. C*, vol. 15, No. 18, pp. 9005-9011 (May 2011).
Zanella et al., "Assembly of shape-controlled nanocrystals by depletion attraction" *Chem. Comm.*, vol. 47, No. 1, pp. 203-205 (Jan. 2011).

* cited by examiner

Examples of 3D supestructures

No lower limit in chain length

The intermediate 2D assembly is actually represented in this case by one chain only, with interruptions The intermediate 2D assembly is actually represented in this case by one octapod only One entire chain is missing

ORDERED SUPERSTRUCTURES OF OCTAPOD-SHAPED NANOCRYSTALS, THEIR PROCESS OF FABRICATION AND USE THEREOF

This application is the U.S. national phase of International Application No. PCT/EP2011/063304, filed 2 Aug. 2011, which designated the U.S.; the entire contents of which is hereby incorporated by reference.

This invention relates to the controlled realization of ordered superstructures of octapod-shaped colloidal nanocrystals, formed either in the liquid phase or on a solid substrate. These structures can be applied in many fields of technology.

STATE OF THE PRIOR ART

There are several reports on the assembly of colloidal nanocrystals into ordered superstructures. Especially in the case of spherical nanocrystals, the formation of complex binary and ternary superstructures has been demonstrated [1-5], together with an improved understanding of the driving forces of self-assembly. Interest in this direction is triggered by the possibility to create nanocomposites with physical properties different from those of the individual building blocks. On the other hand, the formation of ordered superstructures of anisotropic or branched nanocrystals proves more difficult. Only few studies have demonstrated the controlled formation of ordered superstructures in this case. Chains of rods/tetrapods were prepared via selective attachment of molecules to the tips of rods that promoted their assembly or via welding through metal domains while micron-scale assemblies of vertically aligned rods were fabricated directly in solution or randomly on a substrate with several techniques [6]. Only a recent work has reported the assembly of star shaped nanocrystals [7]. In these stars, however, since the aspect ratio of the pods is small, their assembly geometries are not much different from those of spheres.

Compared to the simple nanocrystals described above, the assembly of branched nanocrystals poses several additional challenges. First, it has not been possible until recently to synthesize samples of branched nanocrystals with a sufficiently monodisperse distribution of size and shape, as well as with enough stability in the solution phase, to systematically investigate their assembly. Second, the complex shape of these particles should considerably restrict the rotational and positional degrees of freedom in neighbouring nanoparticles at high volume fractions, which may inevitably trap the crystallization process in "jammed" amorphous structures. On the other hand, the inherent shape of the nanocrystals might already encode the information required to direct their assembly along a preferred path under suitable experimental conditions. Third, compared to spherical, rod-shaped, or polyhedral particles, many densely packed configurations favoured by excluded-volume interactions might exist for branched nanoparticles. These configurations, aside from being kinetically difficult to achieve, may be differently affected by other energy contributions (e.g., Van der Waals, electrostatic, dipolar), making both their experimental realisation and their simulation daunting tasks.

Recently, the inventors of the present application have described a preparation process for obtaining octapod-shaped colloidal nanocrystals. See S. Deka et al. *NANO Letters*, 11 Aug. 2010, Vol. 10, p. 3770-3776, with a sufficiently monodisperse distribution of sizes and shapes. The same group has reported preliminary attempts to produce octapod chain-like structures, which however proved unsuccessful since they lacked long-range order. See M. Zanella et al. *Chem. Comm*, 2011, Vol 47, p. 203-205.

SUMMARY OF THE INVENTION

The present invention is based on the identification of the operative conditions necessary for obtaining superstructures having the desired size and properties.

Accordingly, a first object of the invention is a superstructure consisting of an ordered assembly of octapod-shaped nanocrystals, characterized in that the assembly is in the form of a linear chain comprising at least 20 octapods (1D), or a two-dimensional (2D) assembly of side-by-side aligned linear chains; a three-dimensional (3D) assembly of side-by-side aligned linear chains, or a 2D monolayer of close-packed octapods on a substrate, with each octapod having four pods touching the substrate and four pods pointing away from the substrate In specific embodiments of the invention, the superstructures are either dispersed in a liquid medium, or deposited on a solid support or are in form of an isolated solid precipitate, except for the 2D monolayer of close-packed octapods on a substrate, which can only be on a substrate.

A second object of the invention is a process for preparing the assembly of octapod-shaped nanocrystals comprising the steps of dissolving the nanocrystals in a non-polar or moderately polar solvent or solvent mixture. This step is followed by two alternative operational options. In one embodiment of the invention, the hierarchical assembly of the octapod shaped nanocrystals in solution is triggered by a stepwise modification of the medium in which the octapods are dissolved, with the addition of a second solvent or mixture of solvents, such that the octapod-octapod attractive interactions are steadily increased over the octapod-solvent attractive interactions. The precipitated superstructures are then collected.

In a second embodiment of the invention, the nanocrystal solution is drop-cast on a substrate, causing controlled assembly of the nanocrystals by a combined effect of slow evaporation of the solvent and annealing, whereby the steps of slow evaporation of the solvent and annealing are performed in sequence, i.e. first the solvent is evaporated and then annealing is done.

According to a further embodiment of the invention, the preparation process comprises an additional step of selective ion exchange in the superstructure performed directly after deposition on a support.

According to a still further embodiment of the invention, the preparation process comprises the additional step of creating a monolithic superstructure by oxygen plasma treatment.

Further objects of the invention are devices comprising said superstructures in the form of 1D assembly, 2D assembly, 3D assembly or 2D monolayer directly formed on substrate and their use for the manufacturing of technical articles. Such devices are elements of a photonic crystal structure, elements of a photovoltaic cell, elements of an electronic device, electrodes in $Li^+$ ion batteries, photonic crystals, supports for plasmonic applications, elements of an ion sensor, supports for a redox reaction, nanocontainers or drug delivery agents.

Still other objects of the invention will be evident in the light of the following detailed description.

b,c) Lengthening of the chain by sequential additions of octapods. d) View of a chain from the top, the octapods arranged in 'interlocked' configurations, as depicted by dark and light grey octahedrons of the sketch.

Figure 2:
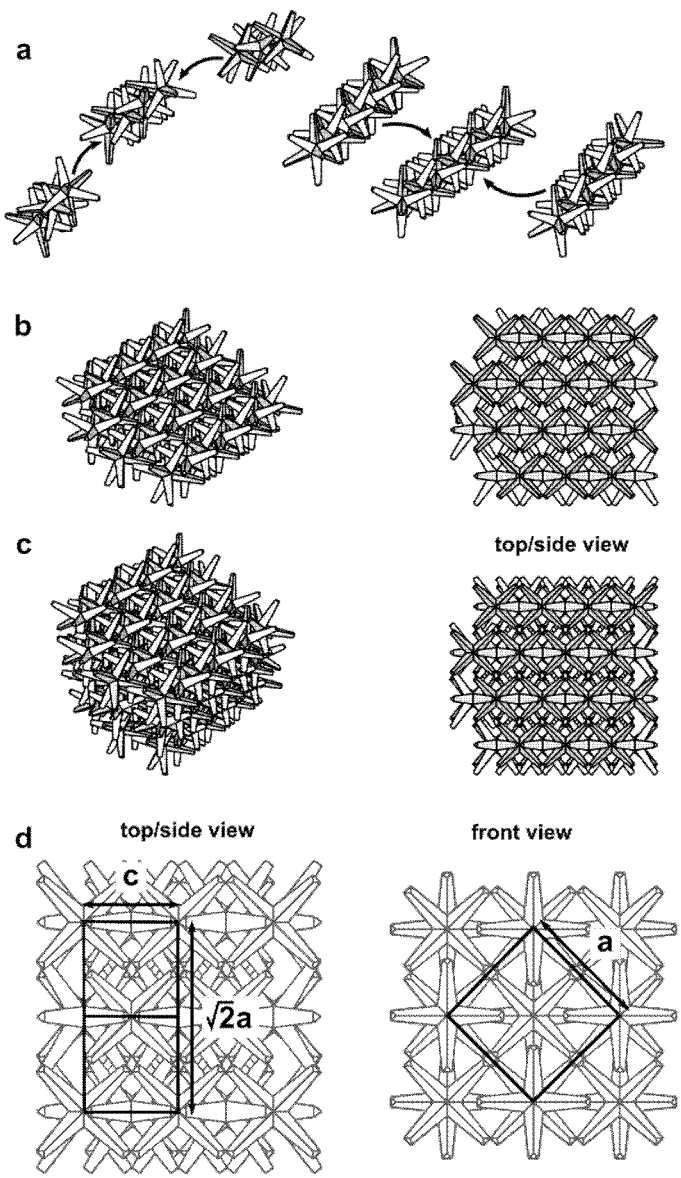

FIG. 2 is a scheme of the formation of 3D superstructures in an aged solution of octapods in toluene after addition of acetonitrile. a) Further lengthening of a chain by on-end attachments; b) side-by-side interactions of chains with sufficient length; c) layers and 3D structures; d) View of the 3D superstructure, the unit cell marked by black lines. The octapod assemblies have tetragonal symmetry, and the octapod chains lie along the [001] direction of the tetragonal cell.

Figure 3:
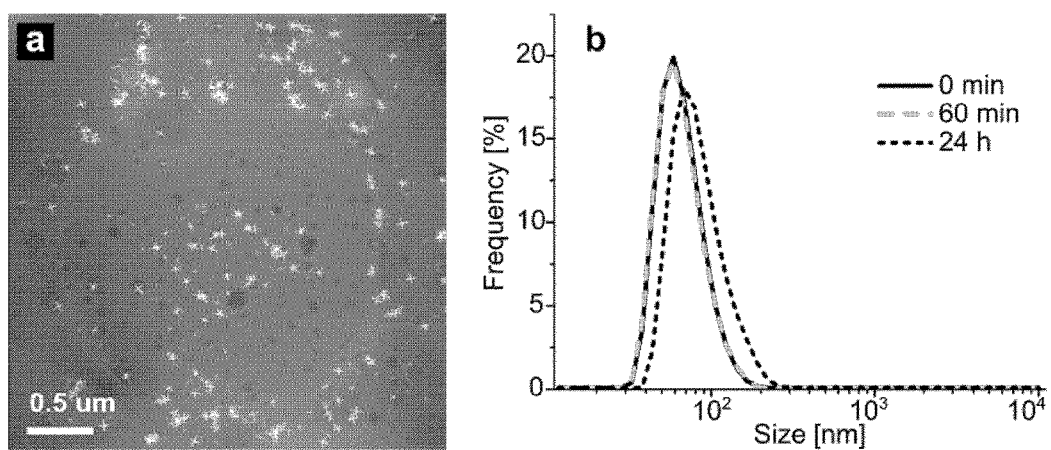

FIG. 3 shows: a) Cryo-STEM image of a thin microdroplet of frozen chloroform solution containing octapods. The droplet is rapidly frozen in liquid nitrogen, and directly observed in the microscope. b) Dynamic light scattering (DLS) from a solution of octapods dispersed in chloroform at the indicated times, after initial sonication of the solution.

Figure 4:
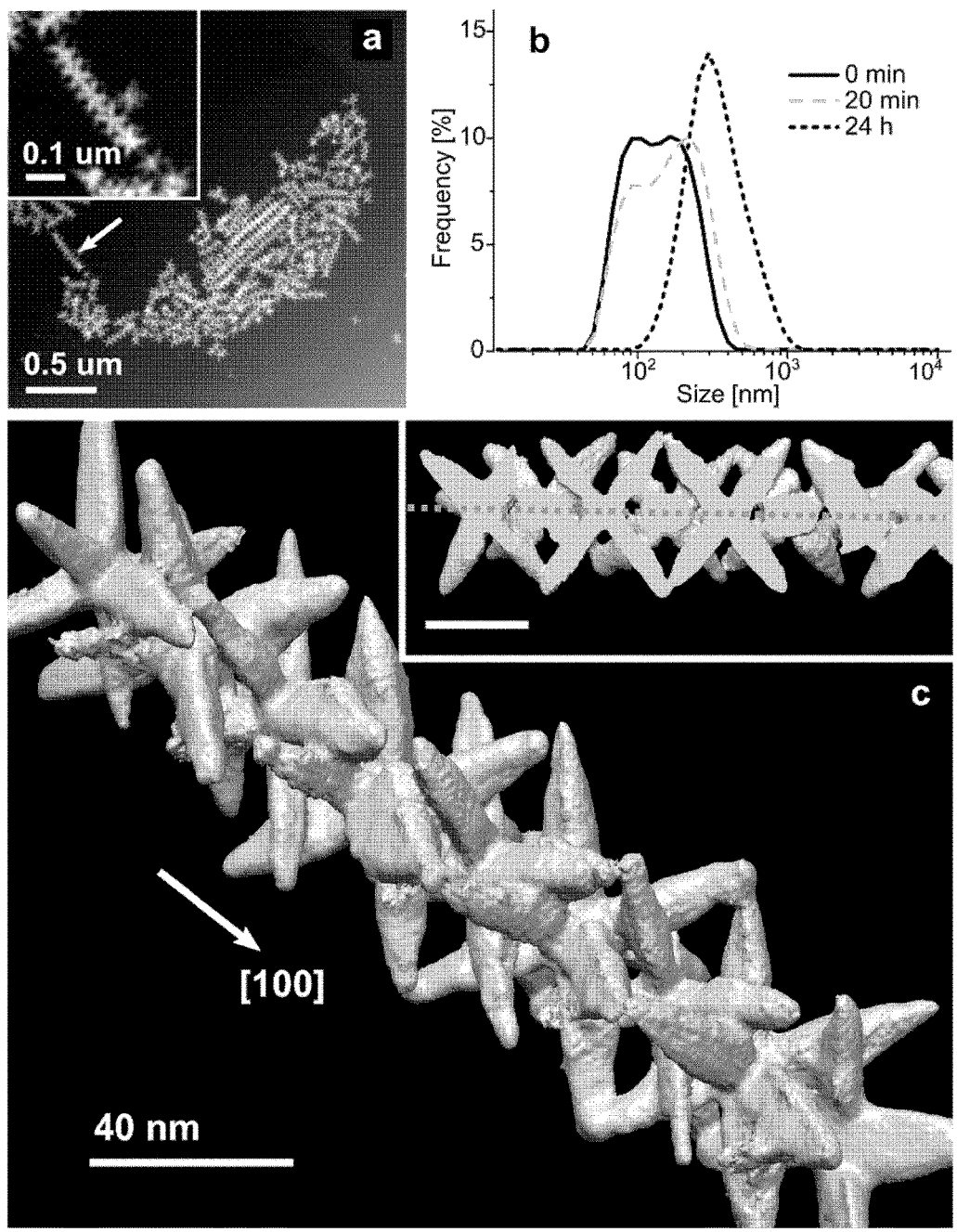

FIG. 4 shows: a) Cryo-STEM image of octapods in toluene. Various octapod chains can be seen. Only occasionally some chains are aligned parallel to each other; b) DLS from a solution of octapods in toluene at 0, 20 minutes, and 24 hours after initial sonication; c) Electron tomographic reconstruction of a linear chain of octapods, with a cross-section from the same chain.

Figure 5:
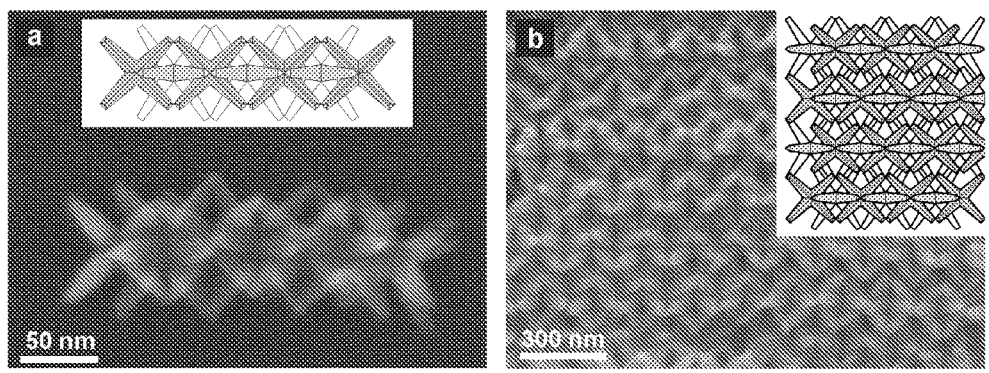

FIG. 5 illustrates: a) SEM image and sketch of a single chain of octapods; b) SEM image and sketch of a 3D superstructure of octapods from a toluene-acetonitrile solution.

Figure 6:
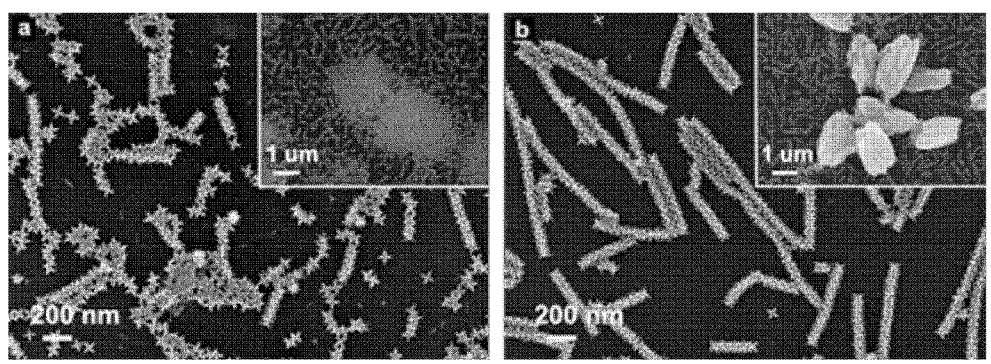

FIG. 6 shows SEM images of a) chains collected on a substrate after precipitation from a toluene solution; b) longer chains collected on a substrate after precipitation from a toluene-acetonitrile solution. The insets show that (a) in toluene no 3D superstructures are formed, while (b) 3D superstructures are formed after addition of acetonitrile.

Figure 7:
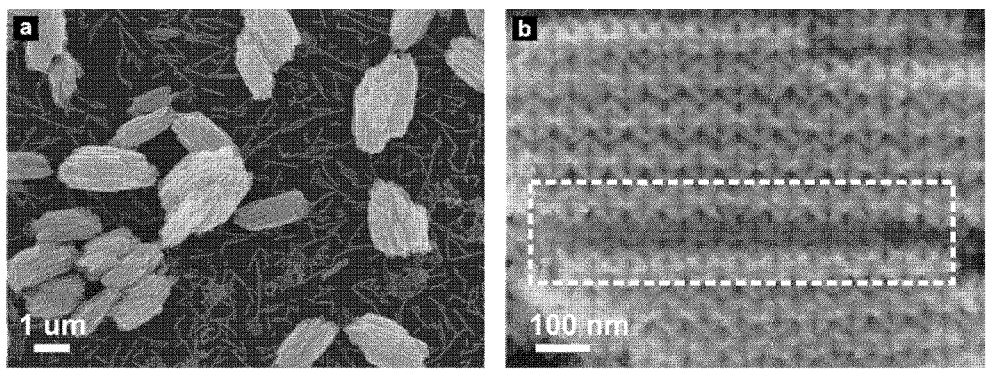

FIG. 7 shows SEM images of: a) chains and ordered 3D assemblies of octapods; b) a 3D superstructure with a missing chain in the middle. For both samples the particles were collected from the precipitate from a toluene-acetonitrile solution.

Figure 8:
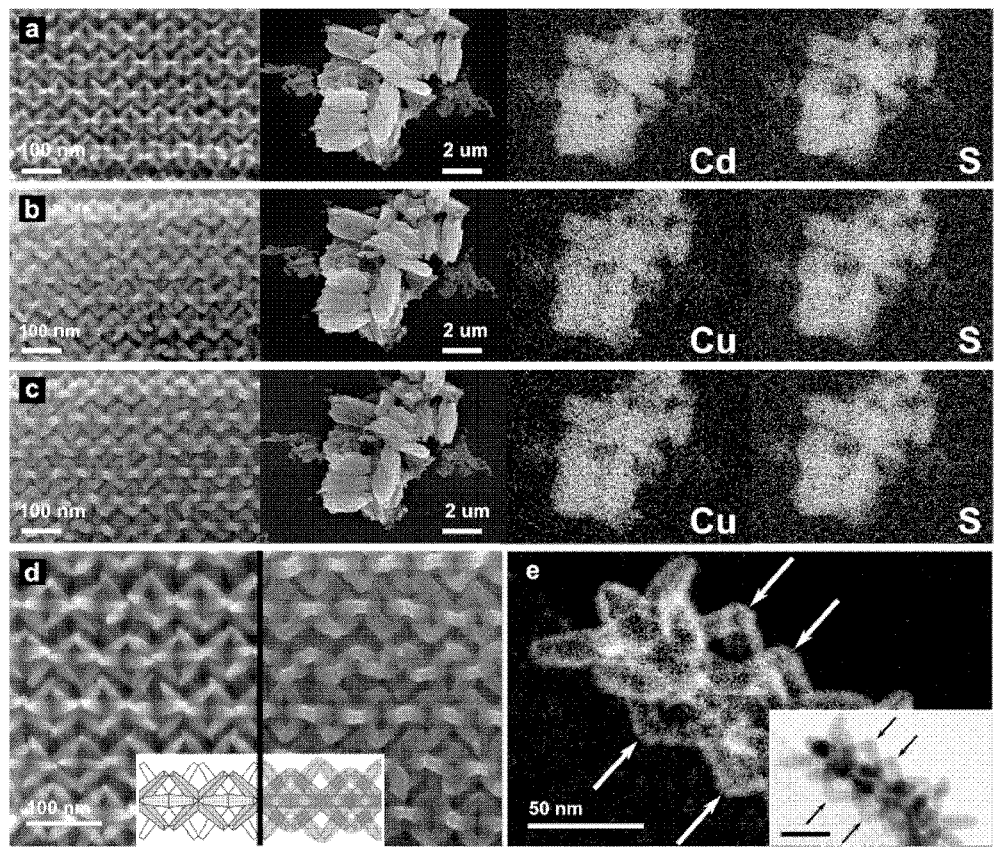

FIG. 8. SEM images of superstructures of octapod-shaped nanoparticles; a) SEM close-up view, SEM low magnification, and Cd and S chemical maps from the as obtained 3D superstructures of CdSe/CdS octapods from a toluene-acetonitrile solution; b) SEM close-up view, SEM low magnification, and Cu and S chemical maps from the same assemblies in a) after $Cd^{2+}$ to $Cu^+$ ion exchange; c) same as b) after $O_2$ plasma treatment, revealing the "chain-like" interlinking of the octapods by welding; d) comparison between the original superstructure in a) and the structure after cation exchange followed by plasma treatment in c). The inset shows a sketch of the oxide shell surrounding the octapods and welding them; e) oxygen chemical map of a portion of a chain of octapods after the same treatment as in c) revealing the oxide shell. The arrows point to welded tips.

Figure 9:
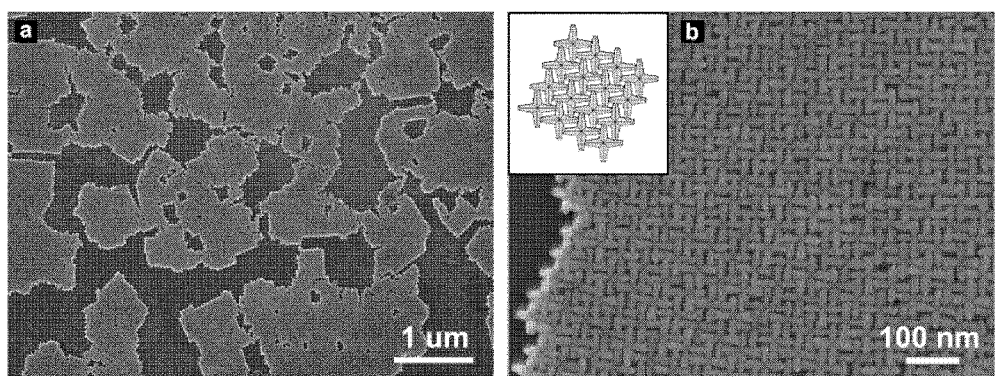

FIG. 9 displays 2D assembling of octapods on a silicon wafer following slow evaporation of the solvent and annealing. a) Low magnification SEM image. b) High magnification SEM image from a monolayer of octapods in a close-packed 2D lattice, as shown in the inset.

Figure 10:
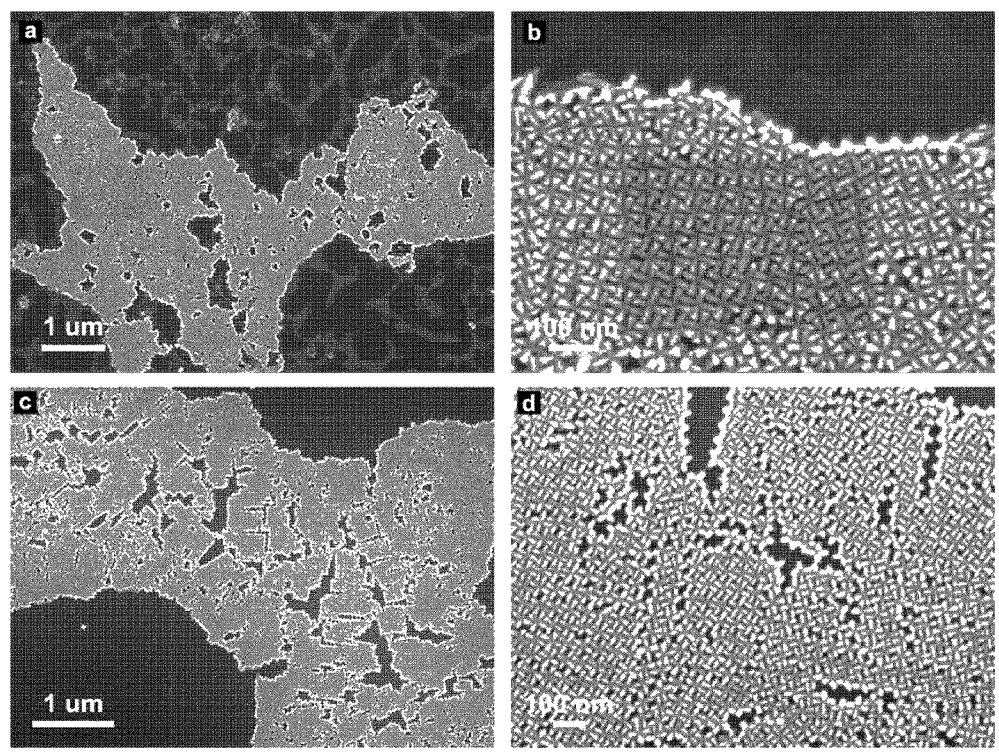

FIG. 10 displays SEM images of 2D superstructures assembled on highly oriented pyrolytic graphite (HOPG) substrates (a-b) and on highly polished (111) silicon wafer coated with 10 nm amorphous carbon (c-d) at different magnifications.

Figure 11:
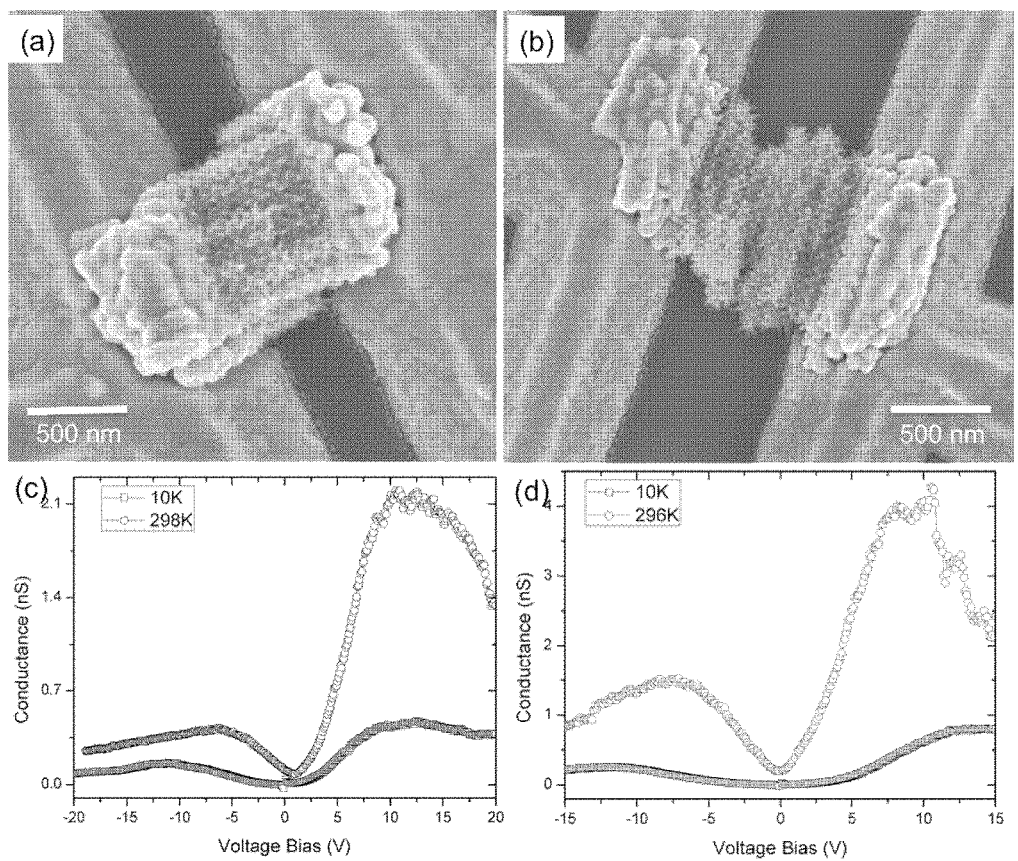

FIG. 11. (a-b) SEM images of 3D octapod superstructures from a toluene-acetonitrile solution that were contacted laterally with planar Cr/Au (thickness 5/200 nm) electrodes. In (a) the octapod chains are oriented across the gap, while in (b) the octapod chains are oriented parallel to the electrode border. (c-d) Photoconductivity versus bias voltage of the two assemblies displayed in (a,b) at room and cryogenic temperature. At high absolute voltage bias negative differential resistance is observed.

Figure 12:
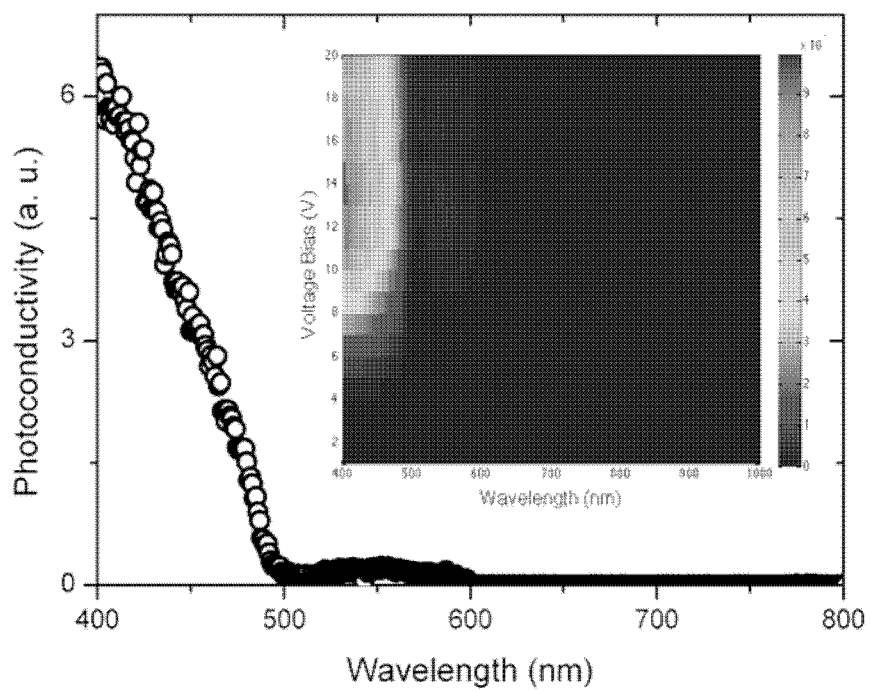

FIG. 12. Photocurrent spectrum recorded on a single 3D superstructure. The inset shows the photoconduction versus voltage bias and illumination wavelength recorded at room temperature.

Figure 13:

FIG. 13. Sketches describing a typical 1D superstructure formed by a chain of octapods. For ease of visualization, each octapod is represented by a smoothed cube and a chain of octapods is simply represented by a chain of 20 octapods or longer.

Figure 14:
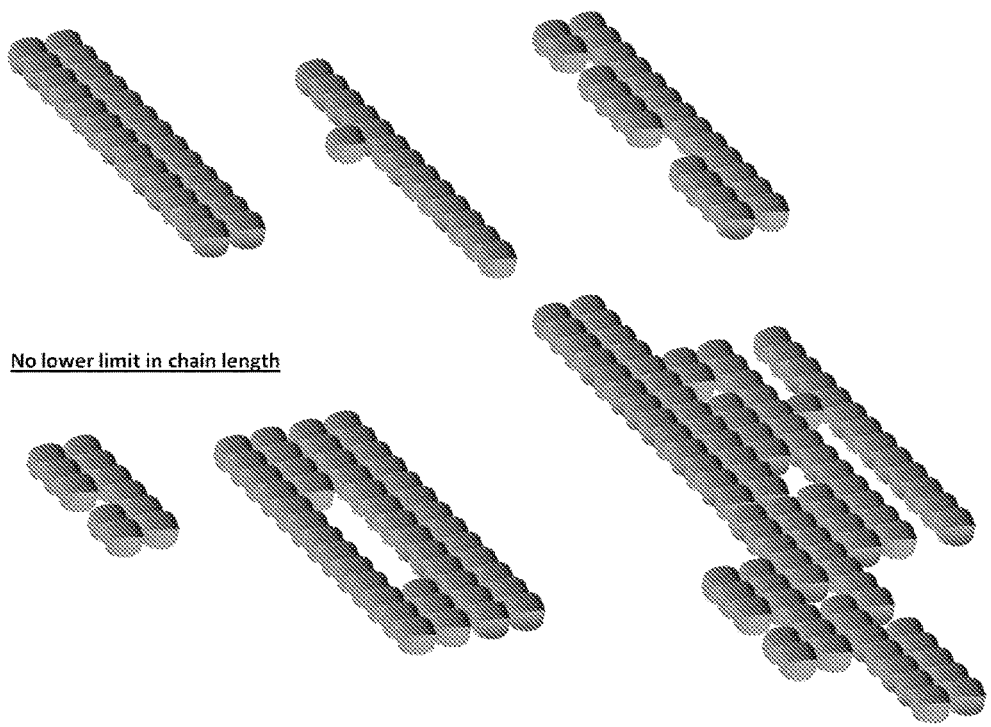

FIG. 14. Sketches describing examples of 2D superstructures. For ease of visualization, each octapod is represented by a smoothed cube. There is no lower limit in chain length.

Figure 15:
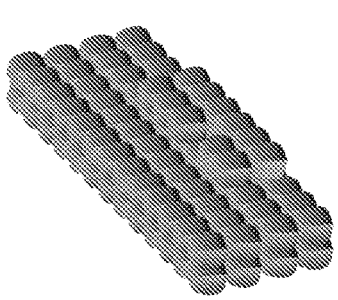
Figure 15:
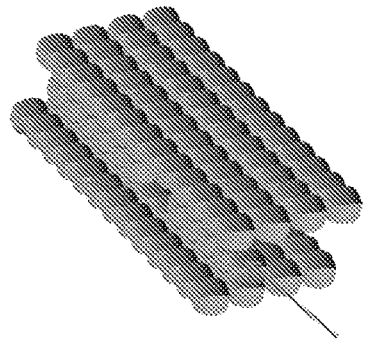
Figure 15:
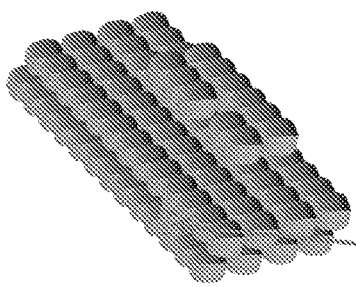
Figure 15:
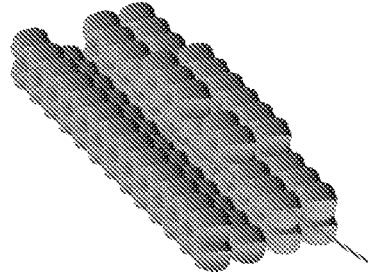

FIG. 15. Sketches describing examples of 3D superstructures. For ease of visualization, each octapod is represented by a smoothed cube. There is no lower limit in chain length. The intermediate layer may be represented by 1 chain only, with or without interruptions. The intermediate layer may also be made by only one octapod.

DETAILED DESCRIPTION OF THE INVENTION

Glossary

The following expressions are used in the present specification with the indicated meaning:

The expression "hierarchical assembly" identifies a specific type of assembly in which individual objects are first assembled into initial superstructures (for example octapods are organized first in octapod chains), then these superstructures interact with each other and organize themselves into new, more complex superstructures (for example octapod chains interact with each other and form ordered three dimensional aggregates of chains that lie side-by-side with respect to one another). This is very common in biological systems.

Figure 1:
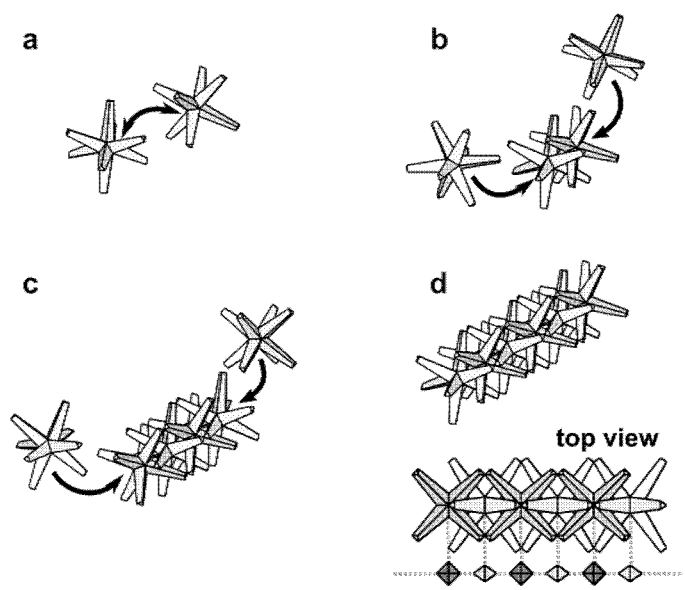
FIG. 1 illustrates a scheme of the formation of linear chains of octapods in toluene. a) Starting dimer formation.

The expressions "interlock (configuration)", "interlocked (configuration)", or "interlocking (configuration)" refer to the structure formed by two octapods close to each other and aligned along the axis passing through their centers, with one octapod rotated by approximately 45° with respect to the other octapod, and found as a basic unit in the (1D) chains, and in many of the two-dimensional (2D) and three-dimensional (3D) superstructures (FIG. 1).

The expressions "superstructure", "(ordered) assembly", or "self-assembling" refer to all kinds of organized structures of octapod shaped nanocrystals, of the same or different chemical composition, comprising the linear chain (1D) of octapods, the 2D assembly of side-by-side aligned linear chains, the 3D assembly of side-by-side aligned linear chains, and the 2D monolayer of close-packed octapods on a substrate, with each octapod having four pods touching the substrate and four pods pointing away from the substrate.

The Octapod-Shaped Nanocrystals

The first step of the process of the invention consists in the preparation of a solution of octa pod-shaped nanocrystals. Octapod-nanocrystals having the necessary properties for self-assembling in the superstructures of the present invention are the object of a concomitant US patent application filed by the same applicant and of a previous publication by the same inventors (see S. Deka et al. supra).

The nanocrystals suitable for the present invention are colloidal nanocrystals of various materials having a core and eight pods with controlled shape and chemical composition and with narrow distributions of the geometrical parameters. In particular, the fraction of non-octapod particles, in the nanocrystal populations has to be less than 5% and the standard deviation of pod length below 10%.

The octapod nanocrystals have the core and the pods made of the same or a different material. The core comprises a material, either elemental or compound, crystallized in a cubic phase selected from a group IV semiconductor, a group III-V semiconductor, a IV-VI semiconductor, a II-VI semiconductor, a single-element material, an oxide of one or more elements, or one material not comprised in the above groups and being selected from $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_9S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, $SiC$ (3C), $SiGe$, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $Cd_xMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, $YF_3$.

The pods comprise a material, either elemental or compound, crystallized in an hexagonal phase selected from: a group III-V semiconductor, a IV-VI semiconductor, a II-VI semiconductor, a single element material, an oxide of one or more elements, or one material not comprised in the above groups and being selected from $Cu_2S$, $Cu_{2-x}S$, $CuSe$, $Cu_2Te$, $Cu_{2-x}Se_{1-y}S_y$, $Cu_2ZnSnS_4$, $CuS$, $Se$, $Co$, $CoSe$, $CoTe$, $CoS$, $Ag_2Se$, $MnS$ $MnTe$, $MnSe$, $MnTe_{1-y}Se_y$, $SiC$ (4H, 6H), $Sb$, $AsSb$, $SbN_9$, $Zn_{3.83}Sb_3$, $Bi_2Te_3$, $CdSb$, $LiNbO_2$, $LiNbO_2$, $PbI_2$ $MoSe_2$, $As_{0.6}Ga_{0.6}Mn_2$, $AsMn$, $Ag_{0.144}Ga_{1.286}S_2$, $Pt_2Si_3$, $Pt_2Si$.

In a specific embodiment of the invention, core and the pods may be chalcogenides or oxides of different or identical elements, and said elements are any elements capable to form a stable compound with the chalcogenide or with oxygen.

For instance the core may consist of a chalcogenide or oxide of an element selected from the group comprising Cd, Cu, Zn, Ag, Au, Pb, Pt, Fe, Mn, Co, or mixture thereof and the pods may consist of a chalcogenides or oxide of an element selected from the group comprising Cd, Cu, Zn, Ag, Au, Pb, Pt, Fe, Mn, Co, Ge, Sn, Nb, Li, B or mixture thereof.

Specifically suitable are colloidal octapod-shaped nanocrystals in which the core consists of $CdSe$, $Cu_2Se$, $Cu_{2-x}Se$, $Cu_{2-x}Se_{1-y}S_y$, $CdSe_{1-y}S_y$, $CuSe$, $Ag_2Se$, $CoSe$, $ZnSe$, $MnSe$, $ZnO$, $MnO$, $CoSe$, $CoO$, or mixture thereof and the pods consist of $CdS$, $Cu_2S$, $Cu_{2-x}S$, $CdSe_{1-y}S_y$, $Cu_{2-x}Se_{1-y}S_y$, $CuS$, $Ag_2Se$, $Ag_2O$, $Ag_2S$, $PbSe$, $CdSe$, $PbS$, $ZnS$, $MnS$, $CoS$.

Examples of preferred octapods are: CdSe(core)/CdS (pods), CdSe(core)/CdSe(pods), CdSe(core)/CdTe(pods), $Cu_2Se$(core)/$Cu_2S$(pods), $Cu_{2-x}Se$(core)/$Cu_{2-x}S$(pods), CuSe(core)/CuS(pods), $Ag_2Se$(core)/$Ag_2S$(pods), PbSe(core)/PbS(pods), ZnSe(core)/ZnS(pods), MnSe(core)/MnS (pods), CoSe(core)/CoS(pods), CdSe(core)/[CdS+$Cu_2S$] (pods), CdSe(core)/[CdS+$Ag_2S$](pods).

The specific conditions and the parameters involved in the synthesis of CdSe(core)/CdS(pods), CdSe(core)/CdSe (pods), CdSe(core)/CdTe(pods) octapods nanostructures are reported in the table 1 below.

TABLE 1

| | CdSe/CdS | CdSe/CdSe | CdSe/CdTe |
|---|---|---|---|
| $Cu_{2-x}Se$/(mol) | 0.3 * $10^{-9}$M | 0.3 * $10^{-9}$M | 0.3 * $10^{-9}$M |
| Precursor solution[a] | S-TOP 0.5 g | Se-TOP 0.5 g | Te-TOP 0.1 g |
| $T_{[injection]}$/(° C.) | 320-380 | 300-350 | 280-320 |
| Grow time/(min) | 7 | 7 | 7 |

[a]Solution concentrations: S-TOP = 32 mg/ml, Se-TOP = 12 mg/ml, Te-TOP 10 wt %

The Process for Preparing the Octapod Nanocrystals

The starting octapod nanocrystals may be prepared according to the following processes, comprising the two essential steps:

1) Synthesizing large colloidal nanocrystal "seeds" in a cubic phase having 8 well developed {111} facets, meaning that the surface area of each (111) facet is at least 1 $nm^2$.

2) Growing the "pods" of a materials crystallizing in an hexagonal crystal phase onto the seeds, each of them growing on one of the eight {111} facets of the seed, with its [0001] direction parallel to one of the [111] directions of the seed. (Henceforth, the 4-index Miller-Bravais notation will be used for naming crystallographic planes and directions of the wurtzite pods).

3) Optionally, the "as-synthesized" octapods are then subjected to a cation exchange procedure, that is, they can be converted totally or partially into octapods of other materials upon cation exchange or via an oxidation reaction, the latter possible also via an oxygen plasma treatment.

The Seeds

The nanocrystal seeds suitable for the present invention are large nanocrystal with uniform sizes, and larger than 5 nm, for instance in the 10-15 nm range, and having 8 well developed {111} facets. The seed crystals are in a cubic phase and have preferably an octahedral shape, but alternatively can also have a truncated octahedral shape or cuboctahedral shape.

The seeds are synthesized as described in the examples from any material for which a shaped controlled procedure is known and well developed in the art. Examples of synthesis of large (i.e. larger than 5 nm) octahedral-shaped seeds of PbSe (i.e. a II-VI semiconductor crystallized in a cubic phase) can be found in Ref. [20]; examples of synthesis of large cuboctahedral-shaped seeds of cubic $Cu_{2-x}Se$ can be found in Ref. [15]. Other examples of syntheses of large (i.e. larger than 5 nm) nanocrystals crystallized in a cubic phase and with well developed 111 facets are: Ref. [16] for $Cu_2O$, Ref. [17] for MnO, Ref. [18] for PbS, Ref. [19] for $YF_3$, Ref. [20] for $In_2O_3$.

The seeds consist of or comprise a material, either elemental or compound, selected from the group comprising:

A group IV semiconductor crystallized in a cubic phase, a group III-V semiconductor crystallized in a cubic phase, a IV-VI semiconductor crystallized in a cubic phase, a II-VI semiconductor crystallized in a cubic phase, a single-element material crystallized in a cubic phase, an oxide of one or more elements crystallized in a cubic phase, or one material not comprised in the above groups and being selected from $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_9S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, $SiC$ (3C), $SiGe$, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $Cd_xMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, $YF_3$.

In an embodiment of the invention the nanocrystal seeds are chalcogenides or oxides of any suitable elements capable to form a stable compound with the chalcogenide or with oxygen.

Particularly suitable nanocrystal seeds for the invention are sphalerite CdSe nanocrystals of octahedral or truncated octahedral habit.

In a specific embodiment of the invention the starting nanocrystal seeds are colloidal $Cu_{2-x}Se$ nanocrystals, with "x" ranging from 0 to 0.40. Preferably, these seeds are in the cubic berzelianite phase, having uniform sizes and diameters ranging from 10 to 15 nm. Alternatively, the starting material can be an alloy such as $Cu_{2-x}Se_{1-y}S_y$, or $CdSe_{1-y}S_y$, for instance $Cu_{1.94}Se_{0.69}S_{0.31}$, $Cu_{1.98}Se_{0.55}S_{0.45}$, $CdSe_{0.72}S_{0.28}$, $CdSe_{0.47}S_{0.53}$.

Cation Exchange Reaction on the Seeds

Provided that the nanocrystal seed material of the invention comprises at least one cation species, the chemical characteristics of the nanocrystal seeds of the invention can be modified by partial or full cation exchange reaction.

Accordingly, the starting nanocrystal seeds are subjected to a cation exchange reaction by contacting the nanocrystals comprising a first cation with a chemical species releasing a second different cation. This cation derives from a material, either elemental or compound, selected from the group comprising:

A group IV semiconductor crystallized in a cubic phase, a group III-V semiconductor crystallized in a cubic phase, a IV-VI semiconductor crystallized in a cubic phase, a II-VI semiconductor crystallized in a cubic phase, an oxide of one or more elements crystallized in a cubic phase, or one material not comprised in the above groups and being selected from $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_9S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, $SiC$ (3C), $SiGe$, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $Cd_xMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, $YF_3$.

Likewise, the material of the first seed nanocrystal can be a material of the above list.

Example of chemical species releasing cations are metal alkylphosphonates, alkyl carboxylates, or species like for example tetrakis(acetonitrile)copper(I) hexafluorophosphate.

Starting seeds, which can advantageously be subjected to cation exchange, are anyone of those described above, for example $Cu_{2-x}Se$, or an alloy such as $Cu_{2-x}Se_{1-y}S_y$, or $CdSe_{1-y}S_y$, for instance $Cu_{1.94}Se_{0.69}S_{0.31}$, $Cu_{1.98}Se_{0.55}S_{0.45}$, $CdSe_{0.72}S_{0.28}$, $CdSe_{0.47}S_{0.53}$.

For example, berzelianite $Cu_{2-x}Se$ nanocrystals are converted by the addition of $Cd^{2+}$ cations into CdSe nanocrystals in the cubic sphalerite phase. This conversion maintains the habit of the berzelianite $Cu_{2-x}Se$ nanocrystals, thus the sphalerite CdSe nanocrystals have an octahedral habit, or truncated octahedral habit, with a diameter larger than 5 nm.

Sphalerite CdSe nanocrystals with diameters larger than 5 nm range could till now not be produced by any other procedure than the cation exchange procedure presented here. Hence, the intermediate formation of these sphalerite CdSe seeds with eight {111} facets well developed is the key point for the subsequent growth of octopod shaped nanocrystals.

Yet, not only binary components like $Cu_{2-x}Se$ can be cation exchanged. Also e.g. alloyed components like $Cu_{2-x}Se_{1-y}S_y$ can undergo cation exchange reactions in which the anionic composition and shape remain the same (thus yielding e.g. $CdSe_{1-y}S_y$ with the same y value as the $Cu_{2-x}Se_{1-y}S_y$ nanocrystals they were made from), which can give access to structures that are not accessible by other procedures. Therefore starting materials for the process of the invention can also be the aforementioned alloys.

Although not necessarily, the success of the cation exchange reaction may depend on the presence in the reaction medium of suitable surfactants or mixture thereof. Examples of surfactants suitable for the present invention are alkylphosphines, alkylphosphine-oxides, alkylphosphonic acids, alkylamines, fatty acids or alkanes, alkenes, aromatic compounds and ethers. Specific examples are: trioctylphosphine (TOP), trioctylphosphine oxide (TOPO), octadecylphosphonic acid (ODPA), hexylphosphonic acid (HPA), oleylamine (OLAM), oleic acid (OLAC), 1-octadecene (ODE).

For instance, in a typical cation exchange reaction, $Cu_{2-x}$Se nanocrystals are dissolved in trioctylphosphine (TOP). Equally, $Cd^{2+}$ ions are preferably used in the form of cadmium alkylphosphonate, for example a mixture of hexyl- and octadecyl-phosphonate in trioctylphosphine oxide (TOPO), or in the form of cadmium oleate.

Suitable solvents for the reaction are the same surfactants seen above or are e.g. 1-octadecene and various other organic solvents with a boiling point higher than the reaction temperature for example squalane or alkyl ethers.

The reaction is performed at temperature between 100° C. and 400° C., for instance 300° C., 320° C. or 350° C., for a time between 1 and 10 min. However, several tests have shown that the reaction is mainly completed after 1 min if, for example, the exchange is done at 300° C., and longer reaction time does not significantly influence the final product. Also, room temperature reactions can also be carried out, but these can take up to several hours.

After the cation exchange reaction, the nanocrystals may be maintained in reaction solution/dispersion and further processed in the subsequent step (i.e. seeded growth). Alternatively they can be washed by repeated precipitations by addition of a suitable solvent, for instance methanol or ethanol, and re-dispersed in a non-polar or moderately polar solvent, for example toluene, chloroform, hexane or any kind of solvent of aliphatic or aromatic halogenated or non-halogenated nature. In view of the subsequent step of seeded growth, the nanocrystals, after the last washing step, can be dispersed in a suitable surfactant, for example in trioctylphosphine (TOP), or in a solvent, for example toluene, chloroform, hexane or any kind of solvent of aliphatic or aromatic halogenated or non-halogenated nature. The obtained nanocrystals with diameters larger than 5 nm are relatively uniform and the sample has a narrow particle size distribution. Starting from $Cu_{2-x}Se$, XRD analysis can be used to confirm that the final product is sphalerite CdSe nanocrystals.

The "Seeded Growth"

In the "seeded growth" approach, pre-formed seeds are present in the reaction environment. Then chemical precursors are introduced in the reaction environment, where they decompose and form the monomer species, which actually cause the nucleation and growth of the pods. The monomer species are indeed deposited preferentially onto the seeds (heterogeneous nucleation) rather than forming separate nuclei in solution (homogeneous nucleation). As the homogeneous nucleation is by-passed by the presence of the seeds, all nanocrystals undergo practically identical growth conditions since their formation, and therefore they maintain a narrow distribution of sizes and shapes during their evolution.

Thus, starting from big nucleation seeds having eight {111} facets, being well developed in terms of surface area, each of these facets has the same probability of acting as nucleation site for a pod growth. Each pod, having hexagonal crystal phase, grows on one of the eight {111} facets of the seed, with its [0001] direction parallel to one of the [111] directions of the seed. The complete crystallographic relationships between the seed and each pod are: seed{111}//pod{0002} and seed[2$\bar{1}\bar{1}$]//pod[10$\bar{1}$0] (the first relationship defines the planar interface alignment, the second the vector alignment, and together they fully describe the epitaxial growth relationship between each pod and the seed of the octapod).

The precursors for growing the pods are chemical species containing at least one of the elements needed to nucleate/grow the seeds and/or the pods. When precursors are introduced in the reaction environment, as a consequence of the high temperature and of the presence of surfactants, they are in general decomposed and they are transformed into other reactive chemical species, the so-called "monomers" or, equivalently stated, "monomer species".

For example, typical chemical precursors are cadmium oxide (CdO) and hexamethyldisilathiane. When CdO is introduced in the reaction environment, it is decomposed for example by a phosphonic acid at high temperature and forms a cadmium phosphonate. Hexamethyldisilathiane on the other hand decomposes and frees sulfur species. Both cadmium phosphonate and these sulfur species for example can be identified with the chemically reactive species (i.e. the "monomer") that actually interact with the seeds and nucleates the pods, or reacts with the growing pods and further contributes to their growth, in both cases depositing Cd species.

The growth precursors generating the various compounds are well known in the art and the skilled person can retrieve the necessary information from the literature.

By way of example, some typical precursors for a II-VI semiconductor are listed hereinafter:

CdX (X=S, Se, Te)

For Cadmium: A cadmium salt or an oxide (for example cadmium nitrate, or cadmium acetate or cadmium oxide), or an organometallic compound (for example dimethylcadmium).

For the chalcogen: the chalcogen in its elemental form (i.e. S, Se, Te) or as organometallic compound (for example bis(trimethylsilyl)sulfide, bis(trimethylsilyl)selenide, bis(trimethylsilyl)telluride, thiourea, selenourea, tellurourea).

Examples of single source precursors: bis(dialkyldithio-/diseleno-carbamato)cadmium(II).

ZnX (X=S, Se, Te)

For Zinc: A zinc salt or an oxide (for example zinc nitrate, or zinc acetate or zinc stearate or zinc oxide), or an organometallic compound (for example diethylzinc).

For the chalcogen: the chalcogen in its elemental form (i.e. S, Se, Te) or as organometallic compound (for example bis(trimethylsilyl)sulfide, bis(trimethylsilyl)selenide, bis(trimethylsilyl)telluride, thiourea, selenourea, tellurourea).

Examples of single source precursors: bis(dialkyldithio-/diseleno-carbamato)zinc(II)

$Cu_yX$ (X=S, Se, Te)

For Copper: A copper salt (for example copper nitrate, or copper acetate or copper chloride)

For the chalcogen: the chalcogen in its elemental form (i.e. S, Se, Te) or as organometallic compound (for example bis(trimethylsilyl)sulfide, bis(trimethylsilyl)selenide, bis(trimethylsilyl)telluride, thiourea, selenourea, tellurourea).

Wurtzite GaP (Example of a III-V nanocrystal forming in an hexagonal phase): a single source precursor can be used here: tris(di-tert-butylphosphino) gallane ($Ga(PBu_2)_3$).

All the precursors generate materials that can crystallize in an hexagonal phase, for example, one of the following materials: a group III-V semiconductor crystallizing in an hexagonal phase, a IV-VI semiconductor crystallizing in an hexagonal phase, a II-VI semiconductor crystallizing in an hexagonal phase, a single element material crystallizing in an hexagonal phase, an oxide of one or more elements crystallizing in an hexagonal phase, or one material not comprised in the above groups and being selected from $Cu_2S$, $Cu_{2-x}S$, CuSe, $Cu_2Te$, $Cu_{2-x}Se_{1-y}S_y$, $Cu_2ZnSnS_4$, CuS, Se, Co, CoSe, CoTe, CoS, $Ag_2Se$, MnS, MnTe, MnSe, $MnTe_{1-y}Se_y$, SiC (4H, 6H), Sb, AsSb, $SbN_9$, $Zn_{3.83}Sb_3$, $Bi_2Te_3$, CdSb, $LiNbO_2$, $LiNbO_2$, $PbI_2MoSe_2$, $As_{0.5}Ga_{0.5}Mn_2$, AsMn, $Ag_{0.144}Ga_{1.286}S_2$, $Pt_2Si_3$, $Pt_2Si$.

It is indeed possible that some materials can crystallize either in the cubic or in the hexagonal phase. Which phase will actually form in the growth environment can be decided based on the reaction conditions, namely temperature, surfactant, solvent. So, in principle the skilled person is well aware of or in any case can easily find in literature, the conditions that lead to crystallization of a material that exhibits polymorphism either in the cubic or in the hexagonal phase.

In a specific embodiment of the invention the precursors will nucleate and grow pods of the following materials: chalcogenides or oxides of any elements capable to form a stable compound with the chalcogenide or with oxygen.

Particularly suitable are cadmium chalcogenides such as CdSe or CdS or also CdO, each used alone.

The pods formed by contacting the seeds with precursors for either "CdS" or "CdSe" will grow in the wurtzite crystal phase, normally with shapes resembling hexagonal prisms.

The seeded growth step is carried out in the presence of suitable surfactants or mixture thereof, which also act as reaction solvent and which are those indicated above as suitable for the cation exchange reaction. For instance, the nanocrystal seeds can be dispersed in TOP together with one or more precursors, while one or more precursor may be dissolved in a mixture of surfactants such as TOPO, HPA and ODPA.

Other solvent suitable for the seeded growth are e.g. octadecene or any solvent with a boiling point higher than the reaction temperature.

The octapod growing step runs for 1 to 10 minutes, mainly 5 or 7 min operating at temperature between 280° C. and 380° C. The step is carried out under inert atmosphere, for instance under nitrogen or argon atmosphere.

The step-by-step process (two pot procedure) describe above, characterized by the subsequent preparation of the nucleation seeds (step 1) and the growth of the pods through the seeded growth (step 2) may be replaced by a one-stage process (one-pot procedure) by in situ ion exchange followed by seeded growth, as illustrated below and in the examples.

Synthesis of Octapods by In Situ Ion Exchange ("One Pot Procedure") Followed By Seeded Growth:

A first solution is prepared, which contains previously synthesized nanocrystal seeds in a suitable solvent, at defined concentration.

This solution is injected into a reaction flask containing a mixture of surfactants and a precursor releasing a different cation and heated at a specified temperature under inert atmosphere. The solvents, the chemical species releasing the cation and the surfactants are the same as described above.

After the injection, the resulting solution is allowed to recover at the pre-injection temperature for at least 3 minutes, after which it is cooled to room temperature (see table 1 for details).

If necessary, this solution is washed by repeated precipitations (via addition of polar solvent) and re-dissolution in less polar solvent. The as-synthesized octapods are stored under nitrogen inside the glove box. Compared to known procedures, this is the only procedure combining cation exchange and a seeded growth procedure in one reaction.

Octapods Cation Exchange

The chemical/physical characteristics of the "first generation" of synthesized octapods nanocrystals may be modified by cation exchange reaction.

The cation exchange reaction of the as-synthesized octapod nanocrystals may be performed according to the method described in WO-A2-2009/009514 or EP-A-2268570 for the preparation of nanorods.

Since the cation exchange is both a repeatable and reversible reaction, the "as-synthesized" octapod-shaped nanocrystals can themselves be subjected to a cation exchange procedure. That is, they can be converted totally or in part into octapods of other materials upon cation exchange. Depending on the operating conditions, this reaction enables either the total cation exchange of the octapods, with replacement of the cation species both in the pods and in the core with different cations, or a partial cation exchange producing binary heterostructures, wherein core and pods consist of different materials, or also ternary or complex heterostructures, in which the pods may consist of segments of two or more different materials.

The total cation exchange is achieved operating with an excess, while the partial cation exchange with a defect, of the exchanging cation. Also in this case, the exchanging cation is preferably (but not exclusively) selected from the above indicated list of materials suitable for the cation exchange reaction of the seed and the pods. The conditions of the cation exchange reaction are as described above and in the examples.

Partial Cation Exchange on Octapods

By using an amount of exchanging cationic precursor in defect as compared to the amount of octapods, it is possible to perform only a partial exchange. For example, treating CdSe/CdS octapods with the $Cu^+$ ions in defect, the extent of the conversion of the Cd-based octapods into Cu-based octapods depends on the amount of Cu salt that was used for the synthesis. During the partial ion exchange, the core of the octapod does not take part in the reaction while the pods undergo selective ion replacement. The reaction starts at the tips of the octapods pods where the second cation, e.g. $Cu^+$ ions, replaces the first cation, e.g. $Cd^{2+}$ ions, and $Cu_2S$ is formed. Subsequently, the ion exchange reaction extends towards the core of the octapods, increasing the amount of $Cu_2S$ phase and thus reducing the CdS volume. When the reaction is stopped at this stage, a new ternary compound is formed which consists of CdSe core/CdS pods (in the region close to the core)/and a $Cu_2S$ region at the tip of each pod.

Hence, by tuning the amount of added precursor for cation exchange, the volume of the converted material (preferably starting from the tip of the pod) of the pods can be fine tuned from almost zero to complete conversion of the pod material into another material.

A list of octapods that can be accessed by the above approach by choosing the correct cation exchange precursor comprise all the octapods whose materials of the seeds (cores) and materials of the pods have been described above.

The list of all possible materials is not limited however to that just disclosed above, but includes all materials that can be obtained by subjecting the "as-synthesized" octapods to a cation exchange reaction or to a sequence of cation exchange reactions. Furthermore, upon controlled oxidation of the various nanocrystals, the corresponding oxide nanocrystals are obtained.

Due to the fact that the cation exchange starts preferably from the tips of the pods and proceeds subsequently towards the center (with more and more cation exchange precursor used) it is also possible to obtain segmented multi-component pods by adding different cation exchange precursors subsequently. For example, it is possible to obtain an octapod made from a CdSe core and pods that are made of CdS close to the core, due to a first cation exchange reaction and yet another material at the tip region of the pod, which can again be selected from the above mentioned materials and which is generated in a second partial cation exchange reaction.

Other examples of such segmented structures are: CdSe(core)/CdS(segment1)/$Cu_2S$(segment2)/PbS(segment3), CdSe(core)/CdS(segment 1)/$Cu_2S$(segment 2)/ZnS(segment 3) and similar ones. So these are quaternary octapods.

Total Cation Exchange of the Octapods

When an excess of the exchanging cation precursor, compared to the amount of octapods, is used, the result is a full replacement of cations both in the core and in the pods, which however preserves the shape of the octapod. For example, using an excess of Cu precursor compared to the amount of CdSe/CdS octapods, the result is a full replacement of the $Cd^{2+}$ by $Cu^+$ cations, thus yielding a $Cu_{2-x}$Se-core/$Cu_2S$-pods octapod structure.

A very similar procedure is applied in order to obtain Ag based octapods: using an excess of $Ag^+$ precursor, it is possible to exchange $Cd^{2+}$ cations by $Ag^+$, which yields $Ag_2Se$(core)/$Ag_2S$(pods) octapods.

It is worth to note that the complete cation exchange from Cd based octapods to Cu or Ag cation based octapods also demonstrates the reversibility of the ion exchange reaction, which was used to obtain the octapods in the first place. That means that, starting from a $Cu_{2-x}$Se seed, CdSe-core/CdS-pods octapods were produced, via an intermediate (in situ) $Cu^+$ to $Cd^{2+}$ ion exchange step. Upon complete cation exchange of the whole octapod, the core region is transformed back into $Cu_{2-x}$Se yielding $Cu_2Se$/$Cu_2S$ octapods which have a core made of the original $Cu_{2-x}$Se nanoparticles.

Assembly of Octapods

The present application relates to the assembly of the above-described octapod-shaped nanocrystals into ordered superstructures. The superstructures formed by these nanocrystals have no resemblance to those obtained so far using other nanocrystal shapes (spheres, rods, or start-shaped nanoparticles).

It is important to note that the octapod-shaped nanocrystals forming a superstructure according to the invention, need not have all the same chemical composition. Rather, they can be chemically different, provided that they all exhibit the same octapod-shape.

As seen above, the first step of the superstructure preparing process consists of bringing the octapod-nanocrystals into a suitable solvent, capable of keeping the nanocrystals in a solution that is stable over the time, or stable for at least a time-span of 12-24 hours. The solvent is selected from non-polar or moderately polar solvents or solvent mixtures such that in these solvents (or mixtures of solvents) the octapod-octapod interactions, which are basically of van der Weals (vdW) nature, are weak enough that the octapods do not aggregate massively and precipitate out of the solution in this time span. In order to define quantitatively the conditions that can lead to stable solution of octapods, let us observe first that the octapods are coated with surfactants that make their surface hydrophobic, hence these octapods are generally stable in a solvent or in mixtures of solvents with polarity index between 2.0 and 4.5 (see Synder or Burdik & Jakson polarity indexes), Examples of non-polar or moderately polar solvent are selected from the group comprising aliphatic and aromatic halogenated or not halogenated hydrocarbons such as toluene or chloroform.

Following the solubilising step, two alternative assembly schemes have been developed:

One assembly scheme is based on the direct organization of the octapods in the solution phase. This assembly can be triggered by using a proper combination of solvents, which induces a controlled aggregation the octapods into hierarchical superstructures, which may then be recovered as a precipitate.

Another assembly scheme is instead based on a controlled organization of the octapods on a substrate by slow evaporation of the solvent, which can be followed by a heating step. These two assembly schemes are disclosed separately.

Direct Assembly in Solution.

According to the present experimental studies, this type of assembly is hierarchical and takes place as a result of two subsequent events, referable to two levels of organization:

1) Organization of individual octapods in solution to form linear chains of interlocked octapods (FIG. 1).

2) Attractions among octapods nanocrystal chains in solution to form 3D superstructures (FIG. 2).

The sequential occurrence of these two levels of organization may be explained in that the octapods, as obtained, are coated with a monolayer of hydrophobic organic surfactants, such as alkyl phosphine oxides, alkyl phosphines and alkyl phosphonic acids. Therefore, they tend to have favourable interaction with hydrophobic solvents, i.e. solvents that are non-polar or only moderately polar. Consequently, these octapods are generally stable in a solvent or mixtures of solvents with polarity index between 2.0 and 4.5 (see Synder or Burdik & Jakson polarity index), such as toluene or chloroform. In the present case, the interactions between octapods and between octapods and the solvent are mainly of vdW type.

It is known from theory that the vdW interactions between two nanoparticles, of which surfactant-coated octapods are simply a particular case, can be described by equations in which one important parameter is the so called Hamaker constant (A) of the nanocrystal material (or nanoparticles), depending on the medium in which they are interacting [8]. Such a constant acts as a multiplicative factor in the expression defining the interaction potential in that specific medium: the higher the constant in that medium, the stronger the nanocrystal-nanocrystal interactions are in that medium. The Hamaker constants for many types of materials (either organic or inorganic, including solids and solvents) with respect to vacuum are known and tabulated [9-14]. For example, the Hamaker constants over vacuum for CdSe and CdS are quite similar to each other, i.e. $A_{CdS}=A_{CdSe}=11.0 \cdot 10^{-20}$ J, in accordance with Refs. [13] and [14]. Therefore we can assume that nanocrystals made of these materials have the same Hamaker constant, so for the CdSe(core)/CdS(pods) octapods over vacuum we can take $A_{octapods}=11.0 \cdot 10^{-20}$ J. Hamaker constants for various organic solvents over vacuum, using the values in Ref. [9,10] and the Lifshitz theory [11] are reported here:

$$A_{acetonitrile}=4.2 \cdot 10^{-20} \text{ J} \quad \text{(Ref. [9])}$$

$$A_{toluene}=5.4 \cdot 10^{-20} \text{ J} \quad \text{(Ref. [10])}$$

$$A_{chloroform}=5.9 \cdot 10^{-20} \text{ J} \quad \text{(Ref. [11])}$$

Moreover, the Hamaker constants for a mixture of two solvents can be estimated from these known values (see Ref. [12]). For example, for the solvent mixtures (80% acetonitrile/20% toluene) and (60% acetonitrile/40% toluene), we obtain:

$$A_{(acetonitrile(80)/toluene(20))}=(0.8\sqrt{4.2}+0.2\sqrt{5.4})^2 \cdot 10^{-20}$$
$$J=4.4 \cdot 10^{-20} \text{ J}$$

$$A_{(acetonitrile(60)/toluene(40))}=(0.6\sqrt{4.2}+0.4\sqrt{5.4})^2 \cdot 10^{-20}$$
$$J=4.6 \cdot 10^{-20} \text{ J}$$

In this way an effective Hamaker constant for the system consisting of vdW interacting nanoparticles (as the octapods) in a solvent medium, can be estimated from [8]:

$$A_{nanoparticles-solvent}=(\sqrt{A_{nanoparticles}}-\sqrt{A_{solvent}})^2$$

It is clear from this formula that to boost the attractive interaction between the nanoparticles, a solvent or a mixture of solvents with a small Hamaker constant has to be chosen.

The nanocrystals are dissolved at a concentration ranging from $10^{-6}$ to $10^{-11}$ M Also, we note that the octapods are stable in solution if on average octapod-solvent attractive interactions are as strong as octapod-octapod interactions or stronger (as discussed above, in the present case, all these interactions are mainly of vdW type). Without binding the present case to a specific solvent, this situation occurs for example if the octapods are dissolved in a solvent with a Hamaker constant above $5.5 \cdot 10^{-20}$ J. In this case the octapods remain normally stable and in form of isolated particles in solution, as confirmed both by cryo-STEM (FIG. 3a) and dynamic light scattering (FIG. 3b). Fast freezing maintains the dispersion of nanocrystals in the droplet as it was in solution, thus the cryo-STEM images are representative of the dispersion of nanoparticles in solution.

Step 1: Organization of Individual Octapods in Solution to Form Linear Chains of Interlocked Octapods If the octapods are dissolved in a solvent such that octapod-solvent attractions are slightly weaker than the octapod-octapod interactions in that solvent, they slowly start aggregating. Without binding in the present case to a specific solvent, we note for example that this occurs if the octapods are CdSe/CdS and the Hamaker constant of the solvent is between $4.7 \cdot 10^{-20}$ J and $5.5 \cdot 10^{-20}$ J. This is the case if for example the solvent is toluene, or a mixture of toluene and acetonitrile with acetonitrile volume concentration <60%.

If the octapods are CdSe/CdS and if the solvent is toluene, the aggregation occurs on a time scale ranging from a few hours to several days. The aggregation can be followed by dynamic light scattering (FIG. 4b), or again by cryo-STEM, as shown in FIG. 4a, which reports an image of an aliquot taken 12 hours after preparation of the solution. Here, while some octapods are still present in solution as isolated particles, quite remarkably most octapods are arranged in chain-like assemblies, yet not large enough to precipitate. To further investigate the type of organization, a drop of this solution was deposited on a carbon coated TEM grid. After the solvent had evaporated, many isolated chains were found on the carbon support of the grid. A TEM topographic reconstruction of a single chain was then carried out, which revealed that in the chain the octapods are in an "interlocked" configuration (FIG. 4c). In such arrangement, each octapod realizes a close packed configuration with its two neighbouring octapods. Computational modelling revealed that when two octapods approach each other, the "interlocked" configuration is the one that maximises the vdW interactions between them and therefore it corresponds to the most stable configuration (see FIG. 1).

It is also remarkable that the peculiar geometry of the octapods, that is the presence of eight pods in each octapod, drives the assembly towards the formation of linear chains. This can be easily realized by considering that, each time a new octapod adds to the chain, it can do it only by attaching to one of two the ends of the chains, because its attachment to any other site along the chain will be prevented by a large steric hindrance. This is shown in the sketches of FIG. 1 and FIG. 2*a*.

When the solution of octapods in toluene is left for several days, a precipitate forms at the bottom of the vial. When a drop of this precipitate was deposited on a substrate, and then the substrate was imaged under SEM, it consisted mainly of disordered aggregates of several chains, see FIG. 6*a*. Occasionally, two or more chains were seen laying side by side. This aggregation can be explained by considering that at some point in the solution the chains are long enough and there is such a large number of chains that chain-chain interactions become dominant over chain-solvent interactions. The aggregates that are formed as a result of this aggregation are however mostly disordered in this case.

Step 2: Assembling Octapod Nanocrystals into 1D, 2D and 3D Superstructures in Solution.

Assembly of the octapod nanocrystals into ordered superstructures occurs in solution under specific circumstances and is triggered by modifying the properties of the liquid solvent.

The properties of the liquid medium are modified when a strongly polar solvent, or solvent mixture, in which the octapod nanocrystals are insoluble or poorly soluble, is added to the octapod solution. the polarity is modified with a solvent selected from the group comprising nitriles, alcohols, ketones, aldehydes, amines, carboxylic acids and sulfoxides.

The added polar solvent is chosen from solvents having a polarity index ranging from 5.0-6.5 (Synder or Burdik & Jakson polarity index). Without binding the invention to any specific solvent, a suitable solvent is acetonitrile, which is completely miscible with toluene, whereas the octapods are completely insoluble in it. The polar solvent should be added in a sufficient amount to significantly modify the polarity and solvation properties of the medium vis-à-vis the nanocrystals. Normally the polar solvent is in excess over the less polar solvent, such as e.g. 60/40 or 70/30 or 80/20 or 90/10. Assembling of the octapod nanocrystals into ordered superstructures in solution is triggered when the solvent Hamaker constant is reduced below $4.7 \cdot 10^{-20}$ J.

Yet, the sole increasing of the liquid medium polarity, or more appropriately stated, the sole decreasing of the solvent Hamaker constant, may not be sufficient to cause the assembling of the nanocrystals into an ordered superstructure.

As an example, mixing of acetonitrile either with the chloroform solution or with the freshly prepared toluene solution leads to a precipitate of disordered aggregates of octapods. However, a remarkably different type of precipitate is found when acetonitrile is added to an aged solution of octapods, i.e. aged for 12-24 hours, in toluene, in which almost all octapods had already assembled into interlocked chains.

This is indeed one important feature of the "in-solution" assembly process. Namely, the agents or conditions causing the nanocrystals to assemble into a 2D or a 3D superstructure require the presence of pre-formed interlocked nanocrystal chains, acting as a "seed" for the 2D and 3D assembly.

In this latter case, as soon as e.g. an acetonitrile-toluene mixture (20/80) is realized, octapods start aggregating and the solution becomes turbid. A precipitate forms at the bottom of the vial several hours later and the solution turns from turbid yellow to colourless, indicating that basically all the octapods have precipitated. Under SEM, this precipitate consists of three-dimensional superstructures (FIG. 5*b*, 7, 8) of octapods, together with some linear chains (FIG. 6*b*).

The size of these superstructures is defined by the size of the building blocks (i.e. the individual octapods) and by the number of building blocks in each superstructure. 1D assemblies, i.e. assemblies represented by isolated, linear chains of less than 20 octapods are excluded from the scope of the present invention. This limitation in chain length however does not apply when chains (i.e. 1D assemblies) are assembled in 2D and 3D superstructures.

The 2D superstructure is represented by a planar assembly of m chains, each aligned side-by-side with respect to its two neighbouring chains. When considering a 2D superstructure, m is an integer greater than 1, for example 2, 5, 10, 20, 30, 50 100, 500, or more. Therefore a 2D assembly is formed by at least two chains. Each chain in a 2D assembly can have a varying length, i.e. the number N of octapods in each chain can be any number greater than zero, as long as not all chains in the 2D assembly are formed by a single octapod. As an example, a 2D assembly included in the present invention can even comprise a single chain of octapods together with one octapod aligned to one side of this individual chain. Each chain in a 2D assembly can even lack one or more octapods at any locations along the chain. In other words, each chain in a 2D assembly can be made of a linear sequence of shorter chains interrupted by voids, each void represented by one or more missing octapods.

The 3D assembly can then be considered as made by n stacks of 2D superstructures of chains, with n greater than 1, for example 2, 5, 7, 10, 20, 30, 50 or more, each 2D superstructure contained in a plane, as described above, and with the stacking direction being perpendicular to all these planes. Each of the 2D superstructures forming the 3D assembly can have a varying number m of side-by-side assembled chains, as discussed above. Also, in each 2D assembly forming the 3D assembly entire chains can be missing. In other words, when looking at an individual planar 2D assembly in the 3D superstructure, this can be made of m side-by-side assembled chains, and each chain length can be made of any number N of octapods equal to zero (i.e. a missing chain) or greater than zero, as long as not all chain lengths are equal to zero.

Summarizing, the assemblies of octapods that are included in the present invention are:

1D assemblies, i.e. individual chains of octapods, as long as the number N of octapods in the chains is equal to 20 or greater than 20.

2D assemblies, i.e. planar assemblies of m chains of octapods, with m greater than one, each chain aligned side-by-side to its two neighbouring chains. Each chain is composed of a number of octapods greater than zero, as long as not all chains are made of a single octapod. Moreover, each chain can have one or more interruptions, each interruption represented by one or more missing octapods.

3D assemblies, i.e. vertical stacks of n 2D planar assemblies of chains, with n greater than 1, with stacking direction perpendicular to the planes that contain the 2D assemblies. Each 2D assembly is made of m chains of octapods, each aligned side-by-side to its two neighbouring chains. m is generally different for each 2D assembly, and is greater than one, provided that up to n−1 of the n 2D planar assemblies may be replaced by single chains of octapods, wherein each chain is made of a number of octapods greater than zero.

This means that in a 3D assembly, some of the 2D assemblies of which it is composed can actually be made of a single chain or a single octapod, as long as not all the 2D assemblies are actually made of a single chain. each chain can have one or more interruptions, each interruption represented by one or more missing octapods.

The size of the above assemblies, along each spatial dimension, is determined by the spatial extent occupied by each octapod in the assembly along that dimension multiplied by the number of octapods along that spatial dimension. Such size, depending on the size of the octapods, can range from a few microns to several hundreds of microns, for instance 1, 2, 5, 10, 20, 50, 100, 200, 400, 600, 1000 µm or more.

It is important to point out that the above description of 2D and 3D assemblies is only for the sake of a detailed and comprehensive description of all the assembled superstructures covered by this invention. Therefore, it is not meant here that the hierarchical organization proceeds by the sequential assembly of linear chains first into 2D planar superstructures of side-by-side aligned chains, followed by the stacking of these 2D superstructures to form 3D assemblies. In reality, both the 2D and the 3D superstructures are formed by proper assembly of preformed 1D chains.

Several aspects of these samples, for example when prepared in mixtures of toluene and acetonitrile are peculiar: the isolated chains in this case are longer and "more straight" (FIG. 6b) than in the previous case of the chains deposited from toluene (FIG. 6a), as if these new chains were stiffer than the chains deposited from toluene (resulting in a contraction of the distance between neighbouring octapods in the chains of ~6%). In addition, both the morphology and the internal structure of these ordered 3D assemblies indicate that they are formed via a process of aggregation of linear chains. From the morphology alone, it appears clear that the process of formation did not proceed via clustering of individual octapods, especially when considering that, in some of these clusters, entire chains of octapods were missing, see for example FIG. 7b. Also, the nearest-neighbour configuration of each octapod is the same as in a chain, that is each octapod is in an "interlocked" position only with two neighbouring octapods, as in a chain.

Without wishing to bind the invention to specific theories, an explanation of the formation of these ordered 2D and 3D assemblies is as follows: in a mixture of acetonitrile and toluene, octapod-octapod interactions appear to be much stronger than octapod-solvent interactions, which leads to the formation of longer and stiffer chains, i.e. chains in which octapods are more tightly bound to each other than in the toluene case discussed above. These stiffer chains are also more regular, and straighter. At some point in the solution there are mainly straight chains and chain-chain interactions become dominant compared to chain-solvent interactions. This time however, the length and regularity of the chains is such that they can interact with each other more favourably, i.e. straight and long chains are more likely to reach a low energy configuration in which they lay parallel and very close to each other. Therefore, the same type of chain-chain interaction ultimately yields large, ordered 3D assemblies, which at some point precipitate due to gravity.

The process comprises optional steps of recovering by centrifugation, filtration or other suitable techniques for recovering the superstructure precipitate, washing and drying it.

The chain assembled according to the process described in the case of a toluene solution containing CdSe/CdS octapods with pods lengths and diameters equal to 35 nm and 10 nm, respectively, and aged for about 24 hours, have an average length $L=0.41\pm0.09$ µm, corresponding to an average of $N=12\pm3$ octapods per chain (see FIGS. 4, 5a, 6a).

The 2D and 3D superstructures obtained according to the process described in the case of mixing the aged toluene solution with acetonitrile (80% acetonitrile/20% toluene) have an average length along the c-direction $L=2.00\pm0.26$ µm, and average width/height $W=H=0.99\pm0.22$ µm (FIG. 6b), with some chains left with average length $L=0.90\pm0.29$ µm, or approximately $N=27\pm8$ octapods per chain (longer than the case of pure toluene) forming a wetting layer. It is reasonable to expect that the longest chains form the 2D and 3D superstructures, because the attractive interaction between them (see the sketch of FIG. 2a) is stronger.

Examples of the assemblies of octapods that are realized in solutions are sketched in FIG. 13, FIG. 14 and FIG. 15.

Controlled Organization of Octapods on a Substrate Following a Slow Evaporation of the Solvent and Annealing Treatment.

In this assembly scheme, the superstructure is realized by drop-casting or spin coating the octapod solution on a planar substrate. A drop of solution of octapods in toluene is deposited on a solid substrate, and the solvent is allowed to evaporate slowly. The slow evaporation represents an essential feature of this assembly process. Slow solvent evaporation is achieved by placing the substrate with octapod solution in saturated atmosphere of toluene. Upon slow evaporation, the solution is progressively concentrated in octapods, and they start being deposited on the substrate. When a stable film has formed on the substrate surface, i.e. the more volatile components of the solution have evaporated, the sample is annealed, i.e. it is heated, for instance onto a hot plate or with any other heating devices, in order to evaporate the less volatile parts of the organic solution. In the ordered monolayer assembly the peculiar morphology of the octapods is such that they lay on the substrate with four pods touching it, while the other four pods are pointing upwards. Therefore, seen from the top, the monolayer appears locally in projection as a close-packed assembly of "Greek crosses", see FIG. 9. The constraint of the substrate on the three-dimensional organization of the octapods is such that they have to lie close to each other in a configuration as that seen in the SEM image of FIG. 9, and also sketched in the inset. In this type of organization, there is no interlocking of the octapods like in the case of the superstructures formed in solution.

The obtained 2D monolayer of close-packed octapods on a substrate may either cover or not cover entirely the substrate.

Suitable substrates exhibit the property of being wetted well with the octapod solution, which, for octapods in a non-polar or moderately polar solvent (for example toluene) can be for example a silicon wafer, graphite, or a generic carbon substrate. The slow evaporation is carried out over a few hours, that is from 0.5 to 24 hours, or from 0.5 to 10 hours, preferably from 0.5 to 1 hour and typically performed at room temperature, and the baking on the hot plate is done typically at 200° C. for 30 min.

The so obtained 3D assemblies of the invention, once deposited on a substrate may be subjected to further treatments which modify the chemical, physical and mechanical properties of the superstructures and can be relevant for various applications.

Cation Exchange Treatment

A first option is to perform a direct cation exchange on octapods assemblies, by adopting the operation conditions described above in relation to the individual octapod nanocrystals. This procedure allows the cation exchange of the octapods when they are already assembled in 2D or in 3D superstructures, and the superstructures are deposited on a solid substrate. One interesting aspect of this approach is that the procedure is fast and preserves the 3D geometry of the assembly. In practice, no variation in the structure and morphology of the assemblies is observed after the cation exchange treatment (FIG. 8a-b).

Oxygen Plasma Treatment

A second treatment of the 3D assemblies is oxygen plasma treatment. The octapod superstructures which are deposited on a solid substrate, e.g. silicon substrate, are placed in an oxygen plasma under suitable conditions (see example). Following this procedure, the assemblies are "welded" at their tips (see FIG. 8c-e). This is possible because in these 2D and 3D assemblies octapods interlock with each other in a way that their tip regions are very close to each other. One interesting aspect of this welding procedure is that it produces a monolithic structure as a result of the welding of all the nanocrystals at their tips. The welding therefore does improve the mechanical stability of the assembly, and also improves charge conduction through the assembly.

Many types of deposited superstructures have been produced according to the invention. Scanning electron microscopy images (SEM) were taken on freshly deposited solutions on different substrates, as illustrated in FIGS. 9-10.

Applications

The superstructures of octapod shaped nanocrystals can be used for preparing devices, which find many technical applications. Generally speaking, the octapod-shaped nanocrystals can be applied in photovoltaics and as building blocks in highly ordered assemblies, to yield mesoporous materials of controlled porosity that can be applied in catalysis, in ion sensors, as active materials in energy storage applications and as hosts for other molecules and/or nanoparticles, for applications related to drug release/delivery and decontamination of waters. Superstructures of octapods can be used in various photonic and plasmonic applications. Also, if individual octapods or groupings of them are contacted to various electrodes, they can be used as active elements in nanoscale electronic devices.

Moreover, the properties of the mesoporous materials of the invention may be further improved or modulated or new properties can be conferred to them by filling in the voids of the superstructures.

The voids of these superstructures can be filled in a variety of ways. For example, one can put in contact these superstructures with a solution containing the fillers of interest (i.e. molecules/nanoparticles). The solution will diffuse inside the pores due to capillary forces, and upon slow evaporation of the solvent the fillers will remain trapped inside the pores. This process is the same as the one used for filling the pores of a porous material with a consolidating polymer to improve its mechanical stability. Another process can consist in controlled deposition of small molecules from the gas phase, which will condense in the pores of the superstructures.

Specific examples of applications are disclosed hereinafter.

Application of Octapod Superstructures in Photovoltaics

Films obtained by ordered 3D assemblies of octapod-shaped nanocrystals are used in hybrid organic-inorganic photovoltaic cells. More specifically, the void structures in these films are filled with a material (for example molecules/polymers or small nanocrystals) that behaves as good acceptors/conductor for one type of carrier (i.e. electron or hole), while the octapod film is a good acceptors/conductor for the opposite type of carrier. For this, an appropriate alignment of electronic levels of the octapod film and of the material used as "filler" must be realized. In one embodiment of the invention, the voids (i.e. pores) of a 3D ordered assembly of CdS octapods are filled with small CdTe nanoparticles. The choice of these materials is suggested by the fact that the respective band alignments are such that after generation electrons are transferred to the CdS octapods, while the holes are extracted to the CdTe nanocrystals. Various approaches, known from previous art, can be followed to facilitate electronic coupling between the two materials, for example via exchange of the surfactant coating the two types of nanoparticles with shorter molecules, such as pyridine, hydrazine or dithiols, optionally followed by thermal annealing. Some of these approaches are pre-deposition approaches (for example exchange with pyridine), while others can be post deposition (for example annealing).

The formation of two interpenetrated percolating types of networks guarantees the formation of a large interfacial area between the two materials, which increases the rate of charge separation, and increases the probability for photogenerated carriers of opposite charges to reach the anode and the cathode, respectively, i.e. it increases the charge transport and charge collection rates.

In another embodiment of the invention, the voids of a 3D assembly of octapods are filled with a suitable semiconductor material (or a combination of semiconductor materials) and an organic component, for example a molecule/polymer that behaves as good hole acceptors and conductors (for example P3HT), or alternatively a molecule/polymer that behaves as a good electron acceptor/conductor (for example C60 or one of its modifications) if in this combination the octapods behave as good hole acceptor/conductor. Then depending on the relative band alignments, carriers of a given sign will travel preferentially either in the nanocrystal or in the organic percolating network inside the film. Also, band alignments are such that recombination between hole and electron is avoided before they reach the respective electrodes.

The structure can then be sandwiched between electrodes, of which one is transparent to solar light, therefore realizing a solar cell. Upon absorption of light, electron-hole pairs are created inside the cell. The pairs separate at the nanocrystal-nanocrystal interface or organic-nanocrystal interface (depending on the type of film), with electrons staying in one type of percolating network and the holes staying in the other percolating network. Both carriers are able to travel to the respective electrodes.

The ordered superstructures in this case would provide a maximized interface between the hole-conducting component and the electron-conducting component when compared to disordered superstructures, which should increase the performance of the obtained photovoltaic device.

Application of Octapod Superstructures as Photonic Crystals 3D assemblies of octapod-shaped nanocrystals, because of their periodic arrangement in the lattice, can be used as photonic crystal structures, since along any of the three spatial dimensions these is a periodic alternation of two materials (the octapod material and the voids, which can be filled with another substance that can even be air itself) with two different dielectric constants. The range of wavelengths in which the superstructure can act as a photonic crystal can be anywhere from the deep UV to infrared region, depending on the size of the octapods. Missing chains might be used as waveguiding channels in these photonic crystals.

Application of Octapod Superstructures in Electronic Devices 2D and 3D superstructures of octapod-shaped nanocrystals are used in electrical devices. The superstructures can be contacted to electrodes in various geometrical configurations, for example with conducting pathways along or perpendicular to the octapod chain direction. According to the octapod material the electrical carriers can be in the strong (PbSe) or in the weak (CdSe) confinement regime. In particular in the strong confinement regime the architecture of the superstructure should lead to superlattice effects in the electrical behaviour and to the development of mini-bands. Such superlattice effects should be more pronounced in the direction parallel to the octapod chains and thereby should result in directionally sensitive charge transport.

Application of Octapod Superstructures in Li+ Ion Batteries 3D assemblies of octapod-shaped nanocrystals are used as electrodes in Li+ ion batteries. As one example, it is possible to fabricate very light weight, porous conducting carbon substrates. 3D assemblies of octapods are fabricated of the relevant electrode materials like $Li_2S$, and their voids can be filled with highly electrically conductive carbon material. The overall structure has the advantage of expected relatively high mechanical stability combined with a light weight and high porosity. In addition the ionic and electronic conducting pathways are in a 3D network which means that some unwanted loss of contact can be circumvented easily, unlike for example in a 1D wire. Alternatively, the ordered assemblies of octapods could be used as the conductive electrode, and the voids could be filled with a material capable of undergoing reversible lithiation-delithiation processes. Here again the ordered superstructures would provide a maximized interface between the electrode and the active material.

Application of Octapod Superstructures in Plasmonics 3D assemblies of octapod-shaped nanocrystals are used in plasmonic applications, for example in surface enhanced Raman scattering (SERS). It is well known that metal domains (for example gold), can be grown at the tip regions of these nanocrystals. If the growth is performed directly on the assembly, procedures are known from the literature on how to control the size of these domains. In superstructures, it is possible to have metal domains, grown on proximal octapod tips, which would be very close to each other, i.e. separated only by 1-5 nanometers. This creates many "hot spots" in the superstructure, i.e. regions in which there is a strong field enhancement, and which is ideal for Raman signal amplification. Also plasmonic waveguides can be constructed starting from these ordered superstructures, provided that the material of the octapods is a plasmonic material.

Application of Octapod Superstructures in Ion Sensing 3D assemblies of octapod-shaped nanocrystals are also used in ion sensing applications. As one example, a superstructure of octapods in electrical contact between a source and a drain electrode, would exhibit a given charge conductivity behaviour, related to the type of material of which the octapods are made. Upon exposing this device to a solution of cations capable of exchanging the cations of the octapod superstructure, a change in conductivity would be registered, which can be correlated to the type and concentration of ionic species in solution. The sensing response could be fast, due to the porous structure of the network, and could also be reversible, due to the reversibility of the cation exchange reactions.

Application of Octapod Superstructures in Red-Ox Reactions, as Nanocontainers, as Drug Release/Delivery Agents 3D assemblies of octapod-shaped nanocrystals are also used in a wide variety of applications, ranging from redox-reactions and accumulation of chemicals to delivery of drugs/molecules. This is possible thanks to their porous structure, and to the possibility to functionalize the surface of the octapods with moieties that can help to link various molecules, using known surface chemistry. Depending on the desired application, octapods can serve as porous host in which chemicals can continuously diffuse in and out and react when they are inside the networks with other reagents, or they can remain trapped inside and can be released upon application of a well defined external stimulus.

EXAMPLES

Example 1

Self-Assembled Superstructures of Octapod Nanocrystals 1.1. Direct Assembly in Solution.

A stock solution of CdSe/CdS octapods in toluene was stored in a nitrogen filled glove box. Since the octapod suspension in toluene was not stable, a precipitate at the bottom of the vial was clearly visible after 24 hours, therefore the vial was shaken for a couple of minutes in order to re-disperse the aggregates. Then, 100 µL of this solution were transferred into another empty vial and diluted by the addition of 150 µL of toluene (in order to ensure a good starting dispersion of the solution and good reproducibility, the solution has to have the appropriate concentration, which is at least $10^{-11}$ M, a higher concentration preferably leads to the formation of ordered structures). Then the vial was left untouched for 12-24 hours, after which 1 ml of acetonitrile were added. Again the vial was left untouched for additional 2-5 hours, after which a precipitate was seen at the bottom of the vial, and the solution was almost transparent. The wet precipitate was collected with a pipette and was transferred on a conductive substrate for SEM or TEM analysis.

1.2. SEM and (S)TEM Analysis.

The samples for SEM and EDS analysis were obtained by depositing a fresh solution on a silicon flat surface, and imaged in a JEOL JSM-7500FA scanning electron microscope. For cryo-STEM experiments, a vitrified thin film from the solution was obtained by fast plunge freezing a drop of solution on C-flat holey carbon grids (EMS Quantifoil) into liquid nitrogen, and using a cryo-holder (Gatan 626 cryo-transfer) working at −180° C. High angle annular dark field (HAADF) STEM images and energy filtered TEM images were acquired on a JEOL JEM-2200FS transmission electron microscope.

1.3. Controlled Organization of Octapods on a Substrate Obtained by Slow Evaporation of the Solvent and Heating Treatment.

The detailed experimental description of the preparation of these assemblies is reported here. To a toluene solution in which octapods are dissolved (the volume of the solution is 500 µl, with the concentration of octapods being approximately $2.0 \cdot 10^9$ M) 10 µL of methanol are added until the solution becomes turbid. The resulting mixture is then heated on a hot plate at 80° C. for 30 min, followed by centrifugation (10 min at 3000 rpm). This procedure removes excess organic residuals from the solution. The solution is then drop-cast or spin coated onto a silicon, carbon, or graphite substrate, allowing the solvent (toluene) to evaporate slowly at room temperature (RT) in a toluene-saturated atmosphere (0.5 to 1 hour). Finally, the samples were transferred on a hot plate and heated at 200° C. for 30 min. With this approach, monolayer superstructures are prepared depending on the octapod density in solution. A density of $2 \cdot 10^{-9}$ M was used. FIG. 10a and FIG. 10b show monolayers obtained on graphite and carbon coated Si substrates, respectively. The formation of the superstructure is driven in the monolayer case by capillary forces at the surface while the toluene solvent is evaporating, favouring the orientation with the <100> direction of the octapod orthogonal to the surface (i.e. the octapods sit on four pods, see FIG. 9b inset).

Example 2

Direct Cation Exchange on CdSe/CdS Octapods Assemblies

The detailed experimental description of the procedure is as follows: the CdSe/CdS octapod superstructures which are deposited on a silicon substrate, are dipped in a solution of 37 mg $Cu(CH_3CN)_4PF_6$ in 5 mL of methanol for 15 min. Afterwards, the substrate with the cation exchanged substrate is dipped into 5 mL of pure methanol for 15 min to wash away excessive $Cu(CH_3CN)_4PF_6$ and released Cd compounds. This cleaning step is repeated a second time with another 5 mL of pure methanol. Afterwards the sample is allowed to dry for several hours. The results of this procedure are reported in FIG. 8a,b. Following this cation exchange procedure, the CdSe/CdS octapods are converted into $Cu_2Se/Cu_2S$ octapods.

Example 3

Oxygen Plasma Treatment of $Cu_{22}Se/Cu_2S$ Octapods Assemblies

The $Cu_2Se/Cu_2S$ octapod superstructures which are deposited on a silicon substrate are placed in a Gatan Advanced Plasma System (model Solarus 950). The plasma (oxygen plasma) is applied for 3 minutes at an $O_2$ flow rate of 40 sccm and a RF power of 25 W (13.56 MHz). Following this procedure, the octapods in the assemblies are "welded" at their tips (see FIG. 8c-e). This is possible because in these 3D assemblies octapods interlock with each other in a way that their tip regions are very close to each other. One interesting aspect of this welding procedure is that it produces a monolithic structure as a result of the welding of all the nanocrystals at their tips.

It has been showed that the welding improves the mechanical stability of the assembly, and it also improves charge conduction through the assembly. Nanoindentation fracture toughness evaluation with a cube-corner tip was performed on densely occupied areas of a sample after cation exchange and after both cation exchange and oxygen plasma treatment, respectively. After plasma treatment, the load necessary for the indenter tip to cut through the structures raises from 98±26 μN to 124±40 μN, i.e. 25% increase.

Example 4

Electrical Devices of 3D CdSe/CdS Octapod Superstructures

The 3D superstructures that were fabricated in solution were then deposited onto a planar $Si/SiO_2$ substrate via drop casting followed by solvent evaporation. The positions of the targeted 3D superstructures were localized by scanning electron microscopy, and then the electrodes were defined using overlay electron-beam lithography comprising spin-coating of PMMA, resist baking at 200° C. and electron-beam exposure. After this, a Cr/Au layer at a thickness of 5(Cr)/300(Au) nm was evaporated as electrode material, followed by a standard lift off process. FIG. 11a,b demonstrates that the electrode geometry can be chosen perpendicular or parallel to the direction of the octapod chains that constitute the 3D superstructures. We note that in principle also one 3D superstructure could be contacted by four electrodes in a North, South, East, West configuration. It can be expected that the conductive behavior in the direction along the chains differs from the one perpendicular to the chains (see FIG. 11).

Example 5

Photoconductive Properties of Individual 3D CdSe/CdS Octapod Superstructures

The devices described in example 4 were illuminated with a broad band light source coupled to a monochromator, and the photocurrent versus excitation wavelength was recorded. The photoconductivity of the 3D superstructures showed a decrease with increasing voltage bias once a certain bias value was passed, as demonstrated in FIG. 11c,d. This phenomenon is known as "negative differential resistance" and is used in a variety of electrical devices such as gun and tunnel diodes. Therefore, this peculiar electrical behavior that is observed on the 3D superstructures, and not on amorphous films of octapods, makes them an interesting material for electrical device applications. The spectral behavior of the photocurrent is displayed in FIG. 12.

REFERENCES

[1] Shevchenko, E. V., Talapin, D. V., Kotov, N. A., O'Brien, S. & Murray, C. B. Structural diversity in binary nanoparticle superlattices. Nature 439, 55-59 (2006).
[2] Dong, A. G., Chen, J., Vora, P. M., Kikkawa, J. M. & Murray, C. B. Binary nanocrystal superlattice membranes self-assembled at the liquid-air interface. Nature 466, 474-477 (2010).
[3] Chen, Z. & O'Brien, S. Structure direction of II-VI semiconductor quantum dot binary nanoparticle superlattices by tuning radius ratio. ACS Nano 2, 1219-1229 (2008).
[4] Shevchenko, E. V., Kortright, J. B., Talapin, D. V., Aloni, S. & Alivisatos, A. P. Quasi-ternary nanoparticle superlattices through nanoparticle design. Adv. Mater. 19, 4183-4188 (2007).
[5] Evers, W. H., Friedrich, H., Filion, L., Dijkstra, M. & Vanmaekelbergh, D. Observation of a Ternary Nanocrystal Superlattice and Its Structural Characterization by Electron Tomography. Angew. Chem. Int. Ed. 48, 9655-9657 (2009).
[6] Talapin, D. V. et al. CdSe and CdSe/CdS nanorod solids. J Am Chem Soc 126, 12984-12988 (2004).

[7] Huang, T. et al. Controllable Self-Assembly of PbS Nanostars into Ordered Structures Close-Packed Arrays and Patterned Arrays, ACS Nano, 2010, 4(8), 4707-4716.
[8] Israelachvili, J. N. *Intermolecular and Surface Forces* Ch. 11 (Academic Press, London, 1991).
[9] Takenaga, M., Jo, S., Graupe, M. & Lee, T. R. Effective van der Waals surface energy of self-assembled monolayer films having systematically varying degrees of molecular fluorination. *J. Colloid Interface Sci.* 320, 264-267 (2008).
[10] Cao, G. *Nanostructures & Nanomaterials: Synthesis, Properties & Applications* Ch. 2 (Imperial College Press, London, 2004).
[11] Butt, H.-J., Graf, K. & Kappl, M. *Physics and Chemistry of Interfaces* Ch. 6 (Wiley-VCH, Weinheim, 2003).
[12] Anand, M. et al. Thermodynamic analysis of nanoparticle size selective fractionation using gas-expanded liquids. *Ind. Eng. Chem. Res.* 47, 553-559 (2008).
[13] Striolo, A. et al. Molecular weight, osmotic second virial coefficient, and extinction coefficient of colloidal CdSe nanocrystals. *J. Phys. Chem. B* 106, 5500-5505 (2002).
[14] Bergström, L. Hamaker constants of inorganic materials. *Adv. Colloid Interface Sci.* 70, 125-169 (1997).
[15] Deka, S., A. Genovese, Z. Yang, K. Miszta, G. Bertoni, R. Krahne, C. Giannini, and L. Manna, *Phosphine-Free Synthesis of p-Type Copper(I) Selenide Nanocrystals in Hot Coordinating Solvents*. Journal of the American Chemical Society, 2010. 132(26): p. 8912-8914.
[16] He, P., X. Shen, and H. Gao, *Size-controlled preparation of Cu2O octahedron nanocrystals and studies on their optical absorption*. Journal of Colloid and Interface Science, 2005. 284(2): p. 510.
[17] Shanmugam, S, and A. Gedanken, *MnO Octahedral Nanocrystals and MnO@C Core-Shell Composites: Synthesis, Characterization, and Electrocatalytic Properties*. The Journal of Physical Chemistry B, 2006. 110(48): p. 24486.
[18] Shengyu, J. and et al., *Synthesis and characterization of octahedral PbS nanocrystals assisted with mixed cationic/anionic surfactants*. Journal of Physics: Conference Series. 276(1): p. 012211.
[19] Tao, F., Z. Wang, L. Yao, W. Cai, and X. Li, *Shape-Controlled Synthesis and Characterization of YF3 Truncated Octahedral Nanocrystals*. Crystal Growth & Design, 2007. 7(5): p. 854
[20] Lu, W., Q. Liu, Z. Sun, J. He, C. Ezeolu, and J. Fang, *Super Crystal Structures of Octahedral c-In2O3 Nanocrystals*. Journal of the American Chemical Society, 2008. 130(22): p. 6983.

The invention claimed is:

1. A superstructure consisting of octapod-shaped nanocrystals, of the same or different chemical composition, forming an ordered assembly of octapods, characterized in that the assembly is
   a three-dimensional (3D) assembly of side-by-side aligned linear chains comprising at least 20 octapods; the 3D assembly consisting of vertical stacks of n 2D planar assemblies of chains, with n greater than 1, with stacking direction perpendicular to the planes that contain the 2D assemblies, wherein each 2D assembly is made of m chains of octapods, with m greater than one, provided that up to n−1 of the n 2D planar assemblies may be replaced by single chains of octapods, wherein each chain is made of a number of octapods greater than zero.

2. The superstructure according to claim 1, wherein each linear chain in the 2D or 3D assemblies can have one or more interruptions, each interruption represented by one or more missing octapods.

3. The superstructure according to claim 1, characterized in that it is dispersed in a liquid medium, or is deposited on a solid support or is in form of an isolated solid precipitate.

4. The superstructure according to claim 1, characterized in that over 95% of the nanocrystals contained in the starting solution used for preparing the superstructure are octapod-shaped nanocrystals having a core and eight pods and the standard deviation of pods length below 10%.

5. The superstructure according to claim 1 characterized in that
   the core comprises a material, either elemental or compound, crystallized in a cubic phase selected from the group consisting of: a group IV semiconductor, a group III-V semiconductor, a IV-VI semiconductor, a II-VI semiconductor, a single-element material, an oxide of one or more elements, and one material not comprised in the above groups and being selected from the group consisting of $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_9S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, $SiC$ (3C), $SiGe$, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $Cd_xMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, and $YF_3$; and
   the pods comprise a material, either elemental or compound, crystallized in an hexagonal phase selected from the group consisting of: a group III-V semiconductor, a IV-VI semiconductor, a II-VI semiconductor, a single element material, an oxide of one or more elements, and one material not comprised in the above groups and being selected from the group consisting of $Cu_2S$, $Cu_{2-x}S$, $CuSe$, $Cu_2Te$, $Cu_{2-x}Se_{1-y}S_y$, $Cu_2ZnSnS_4$, $CuS$, $Se$, $Co$, $CoSe$, $CoTe$, $CoS$, $Ag_2Se$, $MnS$ $MnTe$, $MnSe$, $MnTe_{1-y}Se_y$, $SiC$ (4H, 6H), $Sb$, $AsSb$, $SbN_9$, $Zn_{3.83}Sb_3$, $Bi_2Te_3$, $CdSb$, $LiNbO_2$, $LiNbO_2$, $PbI_2$, $MoSe_2$, $As_{0.5}Ga_{0.5}Mn_2$, $AsMn$, $Ag_{0.144}Ga_{1.286}S_2$, $Pt_2Si_3$, and $Pt_2Si$.

6. The superstructure according to claim 1, characterized in that the core and the pods of the octapod nanocrystals are chalcogenides or oxides of different or identical elements, and said elements are any elements capable to form a stable compound with the chalcogenide or with oxygen.

7. The superstructure according to claim 1, characterized in that the core of the octapod nanocrystals consists of CdSe, $Cu_2Se$, $Cu_{2-x}Se$, $Cu_{2-x}Se_{1-y}S_y$, $CdSe_{1-y}S_y$, CuSe, $Ag_2Se$, CoSe, ZnSe, MnSe, ZnO, MnO, CoSe, CoO, or a mixture thereof and the pods consist of CdS, $Cu_2S$, $Cu_{2-x}S$, $CdSe_{1-y}S_y$, $Cu_{2-x}Se_{1-y}S_y$, CuS, $Ag_2Se$, $Ag_2O$, $Ag_2S$, PbSe, CdSe, PbS, ZnS, MnS, or CoS.

8. The superstructure according to claim 1, characterized in that the octapod nanocrystal consists of CdSe(core)/CdS (pods), CdSe(core)/CdSe(pods), CdSe(core)/CdTe(pods), $Cu_2Se$(core)/$Cu_2S$(pods), $Cu_{2-x}Se$(core)/$Cu_{2-x}S$(pods), CuSe(core)/CuS(pods), $Ag_2Se$(core)/$Ag_2S$(pods), PbSe(core)/PbS(pods), ZnSe(core)/ZnS(pods), MnSe(core)/MnS (pods), CoSe(core)/CoS(pods), CdSe(core)/[CdS+$Cu_2S$] (pods), or CdSe(core)/[CdS+$Ag_2S$](pods).

9. The superstructure according to claim 1, characterized in that they have been treated by cation exchange or transformed in a monolithic structure by oxygen plasma treatment.

10. A process for preparation of the superstructure of claim 1 comprising the steps of:

dissolving the nanocrystals in a non-polar or moderately polar solvent or solvent mixture having an Hamaker constant between $4.7 \cdot 10^{-20}$ J and $5.5 \cdot 10^{-20}$ J, followed by causing hierarchical assembly of the octapod nanocrystals in solution by modifying the solvent composition such that the solvent Hamaker constant is decreased below $4.7 \cdot 10^{-20}$ J, and collecting the precipitated superstructures.

11. A process for preparation of the superstructure of claim 1 comprising the steps of:

dissolving the nanocrystals in a non-polar or moderately polar solvent or solvent mixture having an Hamaker constant between $4.7 \cdot 10^{-20}$ J and $5.5 \cdot 10^{-20}$ J drop-casting the nanocrystal solution on a substrate and causing controlled assembly of the nanocrystals by slowly evaporating the solvent in a time ranging from 0.5 to 1 hour at R.T.

12. The process of claim 10 wherein the non-polar or moderately polar solvent is selected from the group comprising aliphatic and aromatic halogenated or not halogenated hydrocarbons and the polarity is modified with a solvent selected from the group consisting of nitriles, alcohols, ketones, aldehydes, amines, carboxylic acids, and sulfoxides.

13. The process of claim 10, wherein the nanocrystals are dissolved in toluene, the solution is aged for 12-24 hours, then an excess of acetonitrile is added to the solution.

14. The process of claim 11, wherein, upon drop-casting, the solvent evaporation is performed in solvent saturated atmosphere.

15. The process of claim 11, wherein the solution is drop-casted on a support selected from the group consisting of silicon, carbon and graphite substrates, preferably modified via chemical routes to increase its wetting by the octapod solution.

16. The process of claim 11 further comprising the step of subjecting the nanocrystal superstructures deposited on a solid substrate to a cation exchange reaction and/or to oxygen plasma treatment.

17. A device comprising the superstructures of claim 1.

18. The device of claim 17, that is an element of a photonic crystal structure, an element of a photovoltaic cell, an element of an electronic device, an electrode in $Li^+$ ion batteries, a photonic crystal, a support for plasmonic applications, an element of an ion sensor, a support for a redox reaction, a nanocontainer or drug release/delivery agents.

* * * * *